United States Patent
Okamoto et al.

[11] Patent Number: 6,125,926
[45] Date of Patent: Oct. 3, 2000

[54] HEAT EXCHANGER HAVING PLURAL FLUID PASSAGES

[75] Inventors: Yoshiyuki Okamoto, Nagoya; Kiyoshi Kawaguchi, Toyota; Shigeru Kadota, Kariya; Hajime Sugito, Nagoya, all of Japan

[73] Assignee: DENSO Corporation, Kariya, Japan

[21] Appl. No.: 09/122,263

[22] Filed: Jul. 24, 1998

[30] Foreign Application Priority Data

Jul. 25, 1997 [JP] Japan ................................ 9-200098
Apr. 8, 1998 [JP] Japan ................................ 10-095923

[51] Int. Cl.[7] ........................ F28D 1/00; F28F 1/42; F24H 3/06
[52] U.S. Cl. .................. 165/166; 165/54; 165/152; 165/153; 165/177; 165/183
[58] Field of Search .................. 165/152, 153, 165/166, 183, 177, 54

[56] References Cited

U.S. PATENT DOCUMENTS

| | | | |
|---|---|---|---|
| 1,454,107 | 5/1923 | Curran | 165/153 |
| 1,458,128 | 6/1923 | Curran | 165/153 |
| 1,686,614 | 10/1928 | Hume | 165/166 |
| 2,858,112 | 10/1958 | Gerstung | 165/153 |
| 3,613,782 | 10/1971 | Mason et al. | 165/166 |
| 3,734,135 | 5/1973 | Mosier | 165/177 X |
| 4,386,651 | 6/1983 | Reinhard . | |
| 4,657,070 | 4/1987 | Kluppel | 165/124 |
| 4,945,981 | 8/1990 | Joshi | 165/152 X |
| 5,078,207 | 1/1992 | Asano et al. | 165/166 |
| 5,505,257 | 4/1996 | Goetz, Jr. | 165/183 |
| 5,765,630 | 6/1998 | Bloomer | 165/152 X |
| 5,771,964 | 6/1998 | Bae | 165/177 X |

FOREIGN PATENT DOCUMENTS

| | | | |
|---|---|---|---|
| 123954 | 4/1947 | Australia | 165/152 |
| 565207 | 1/1924 | France | 165/153 |
| 743201 | 1/1956 | United Kingdom | 165/153 |

OTHER PUBLICATIONS

Design Handbook of Heat Exchanger, p. 979, Author unknown, Date Unknown.

*Primary Examiner*—Leonard Leo
*Attorney, Agent, or Firm*—Harness, Dickey & Pierce, PLC

[57] ABSTRACT

A heat exchanger is constructed by laminating rectangular shaped partition walls and corrugated fins alternately. A first fluid passage through which a high temperature internal air and a second fluid passage through which the low temperature external air flows are formed into rectangular parallelopipe-shape the longitudinal direction of which is upper and lower direction. The corrugated fin is disposed inside the fluid passage to incline frontwardly. A first fluid inlet is provided at an upper position and a first fluid outlet is provided at a lower position of the first fluid passage. While, a second fluid inlet is provided at a lower position and a second fluid outlet is provided at an upper position of the second fluid passage. That is, the first fluid and the second fluid flow in an opposite direction to each other. Therefore, because the fluid introduction area of the corrugated fin is large in comparison with that in a conventional counter-flow type heat exchanger, the pressure loss of the fluid is suppressed, and the corrugated fin does not tend to be choked with a dust or the like.

19 Claims, 21 Drawing Sheets

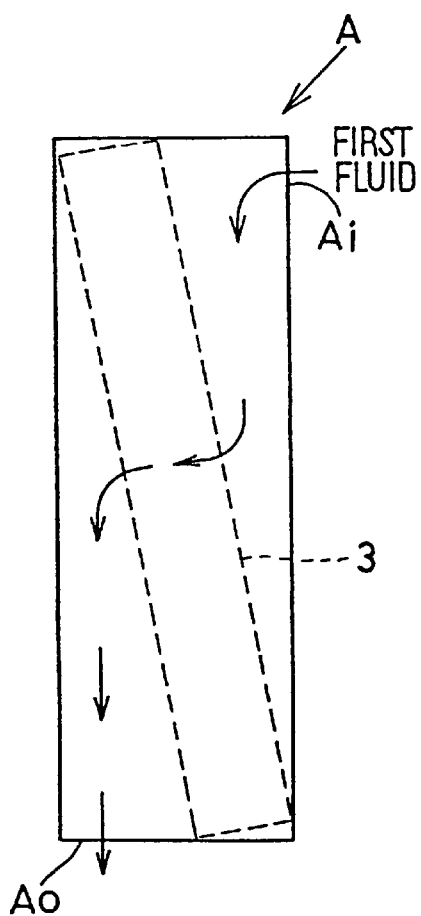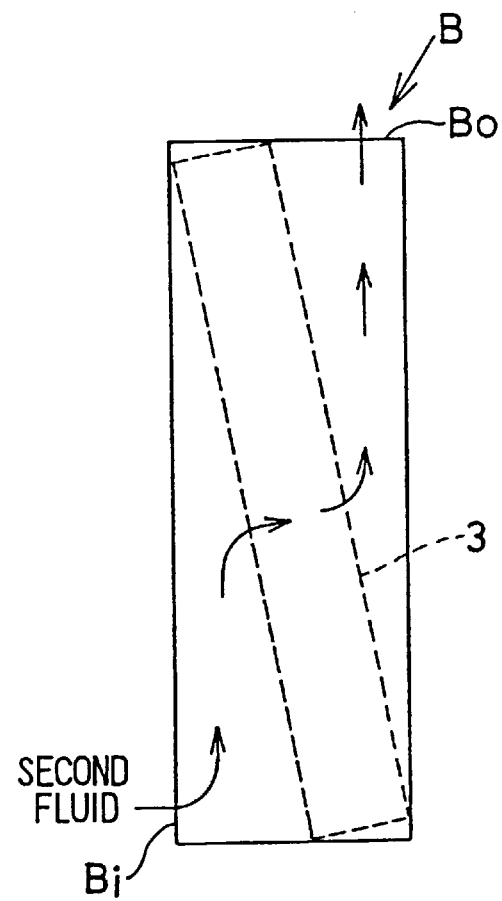

HEAT EXCHANGER HAVING PLURAL FLUID PASSAGES

CROSS REFERENCE TO RELATED APPLICATION

This application is based on and incorporates herein by reference Japanese Patent Application Nos. Hei. 9-200098 filed on Jul. 25, 1997, and Hei. 10-95923 filed on Apr. 8, 1998.

BACKGROUND OF THE INVENTION

1. Field of the Invention

The present invention relates to a heat exchanger carrying out heat exchange between a first fluid and a second fluid, and a box-type cooling unit including the heat exchanger.

2. Description of Related Art

Conventionally, a cross-flow type heat exchanger J1 shown in FIG. 30, and a counter-flow type heat exchanger J2 shown in FIG. 31 are known as a heat exchanger carrying out a heat exchange between a high temperature air and a low temperature air. In the cross-flow type heat exchanger J1, the high temperature air and the low temperature air perpendicularly cross to heat exchange with each other. In the counter-flow type heat exchanger, the high temperature air and the low temperature air flow in opposite directions to heat exchange with each other.

The cross flow type heat exchanger J1 is inferior to the counter-flow type heat exchanger in view of a heat exchanging efficiency.

In the counter-flow type heat exchanger, as shown in FIG. 31, because the cross sectional area of each air passage is small and a corrugated fin J3 is disposed inside the air passage, the pressure loss of the air is increased. Thereby, a fan generating the air flow is large, and high power for driving the fan is also required.

Further, in the counter-flow type heat exchanger, because the air introduction area of the corrugated fin 3 is small, foreign matter such as dust tends to choke the air passage.

SUMMARY OF THE INVENTION

An object of the present invention is to provide a heat exchanger which performs a high efficient heat exchange with a low pressure loss.

According to the present invention, a corrugated fin is disposed inside a fluid passage, and inclines with respect to the length direction of the fluid passage. Thus, the fluid introduction area into the corrugated fin is increased, and the flow-speed of the fluid flowing through the corrugated fin decreases. As a result, the pressure loss inside the fluid passage, where the corrugated fin is disposed, is suppressed.

Therefore, the heat exchanging efficiency of the heat exchanger is improved, a fluid feeding apparatus such as a blower fan can be downsized, and power for driving the fluid feeding apparatus is reduced. Further, because the fluid introduction area into the corrugated fin is increased, the corrugated fin does not tent to be choked with dust or the like.

BRIEF DESCRIPTION OF THE DRAWINGS

Additional objects and advantages of the present invention will be more readily apparent from the following detailed description of preferred embodiments thereof when taken together with the accompanying drawings in which:

FIG. 2A is a schematic view showing a flow of a first fluid in the first embodiment;

FIG. 2B is a schematic view showing a flow of a second fluid in the first embodiment;

DETAILED DESCRIPTION OF PREFERRED EMBODIMENTS

FIRST EMBODIMENT

Figure 1A:
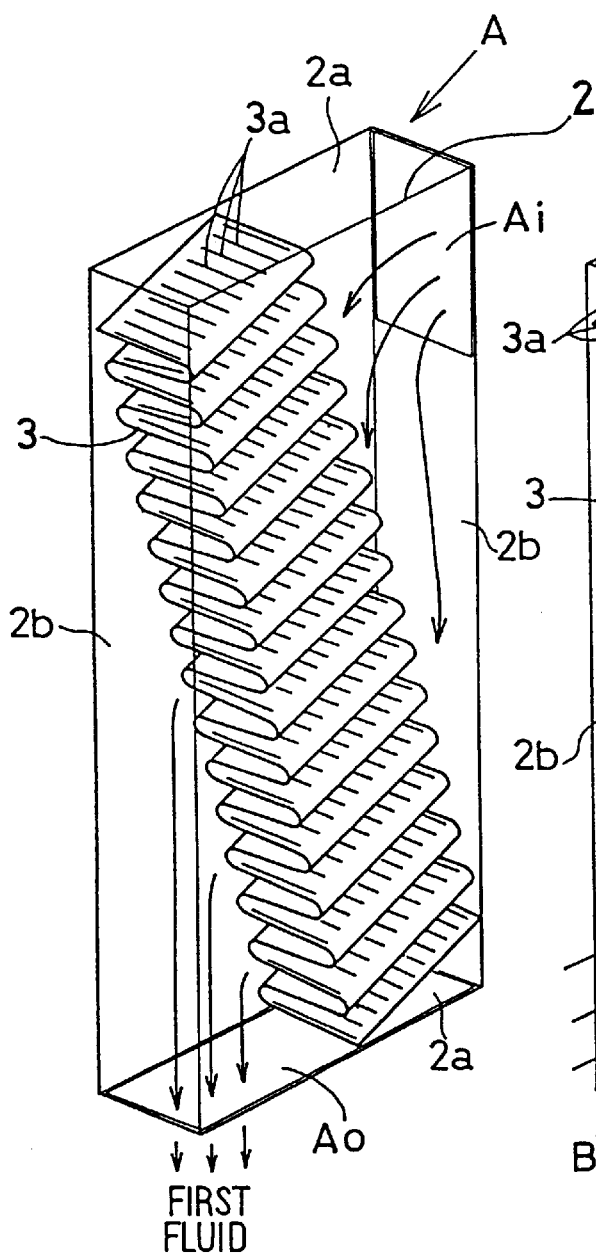
FIG. 1A is a perspective schematic view showing a first fluid passages according to a first embodiment.
Figure 1B:
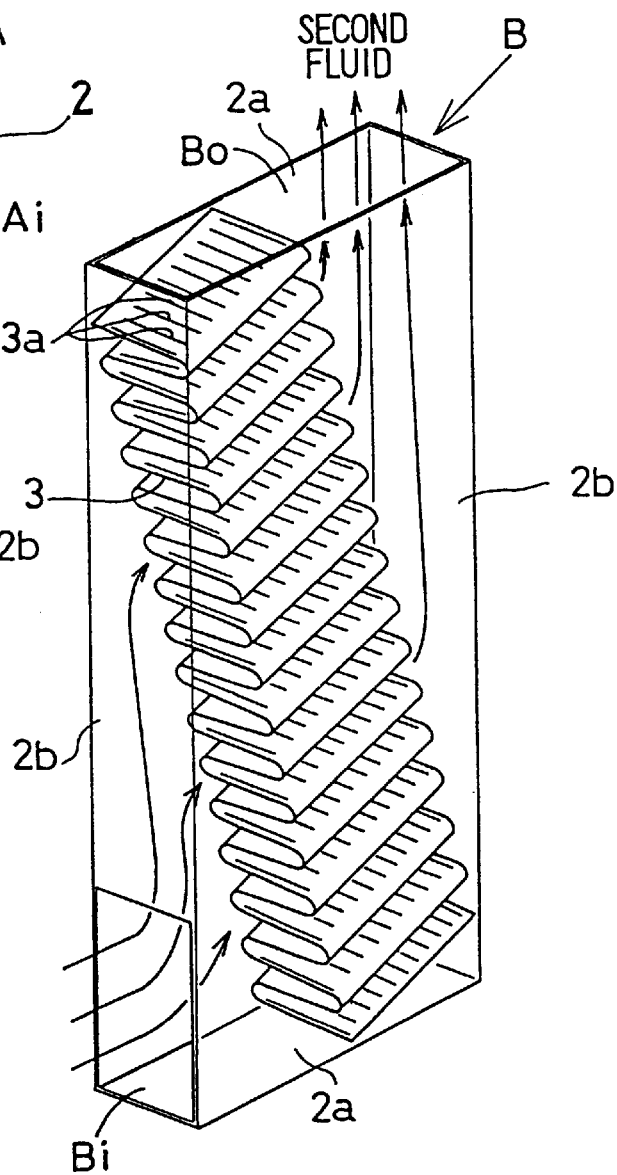
FIG. 1B is a perspective schematic view showing second fluid passages according to the first embodiment.
Figure 3A:
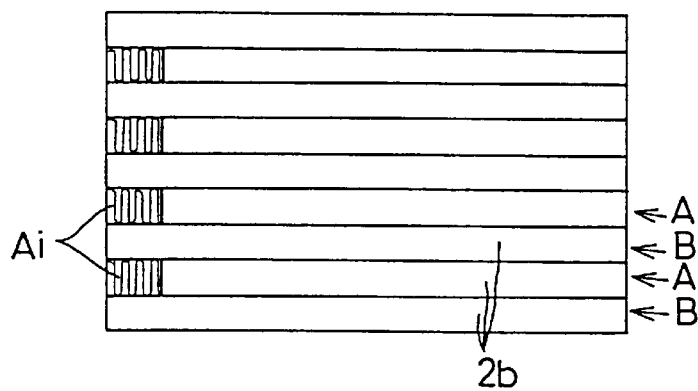
FIG. 3A–E is a development of a heat exchanger according to the first embodiment.
Figure 3B:
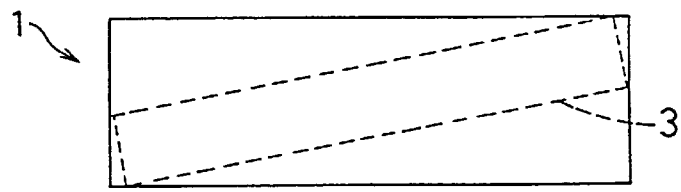
Figure 3C:
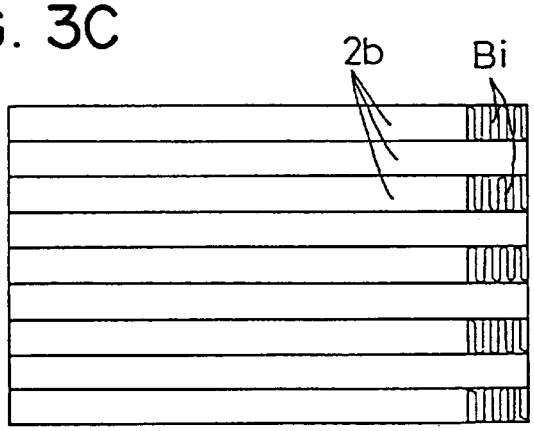
Figure 3D:
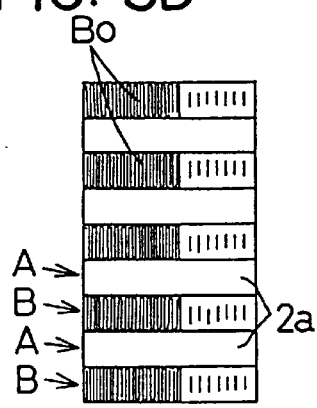
Figure 3E:
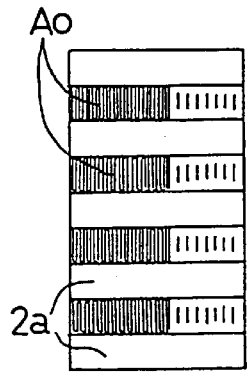

According to a first embodiment, as shown in FIGS. 1–3, a heat exchanger 1 is made of metal superior in heat conductive performance such as aluminum or brass. In the heat exchanger 1, first fluid passages A (FIG. 1A) through which a first fluid (for example, high temperature air) flows and second fluid passages B (FIG. 1B) through which a second fluid (for example, low temperature air) flows are alternately laminated while providing partition walls 2 therebetween. That is, rectangular shaped partition walls 2 and corrugated fins 3 are laminated alternately.

As shown in FIGS. 1A and 1B, each fluid passage A, B is formed by a rectangular parallelopipe-shaped box the longitudinal direction of which is an upper and lower direction. Further, as shown in FIGS. 1A and 1B, each fluid passage A, B includes upper and lower plates 2a and front and rear plates 2b. These compounds forming the fluid passages A, B are brazed integrally with each other.

The first fluid passage A has a first fluid inlet Ai at the back side upper position thereof, and a first fluid outlet Ao at the lower surface thereof.

In a similar way, the second fluid passage B has a first fluid inlet Bi at the front side lower position thereof, and a first fluid outlet Bo at the upper surface thereof.

The corrugated fin 3 is disposed in the first and second fluid passages A, B to incline with respect to length directions of the fluid passages A, B. The corrugated fin 3 is made from a thin plate, and a fin width (width through which the fluid passes) of the corrugated fin 3 is smaller than the widths of the first and second fluid passages A, B. The corrugated fins 3 are disposed in the first and second passages A, B in such a manner that they extend in a substantially diagonal direction of the first and second fluid passages A, B. That is, the corrugated fins 3 incline in a same direction with respect to the longitudinal direction of the first and second passages A, B. Each corrugated fin 3 includes a plurality of louvers 3a being arranged perpendicularly to a fluid-flow direction, for improving a heat exchanging efficiency.

When the first fluid flows in the first fluid passage A and the second fluid flows in the second fluid passage B, as shown in FIGS. 2A and 2B, these fluids flow in opposite directions to each other while passing through the corrugated fins 3. At this time, the first fluid heat exchanges with the second fluid through the corrugated fin 3 and the partition wall 2.

In the heat exchanger 1 of the present embodiment, the corrugated fins 3 incline frontwardly in the first and second fluid passages A, B. Thus, the fluid introduction area into the corrugated fin 3 is made much larger than that in a conventional facing flow-type heat exchanger.

That is, because the introduction area of the corrugated fin 3 is large, the first and second fluids introduced into the first and second fluid passages A, B flow and spread along the corrugated fin 3. Thus the flow-speed of the fluid-passing through the corrugated fin 3 is lowered, and the pressure loss of the fluid in the first and second fluid passages A, B is small. Thereby, flow-amounts of the first and second fluids increase, and high heat exchanging performance of the heat exchanger 1 is attained. Further, fluid feeding apparatuses for feeding the first and second fluids such as a blower fan can be downsized, and power for driving the fluid feeding apparatus can be reduced.

Further, because the corrugated fin 3 is disposed to incline in the first and second fluid passages A, B, the pressure loss of the fluid is small. Therefore, even when the corrugated fin 3 having the plurality of louvers 3a is employed, the pressure loss can be suppressed to under that in the conventional facing flow-type heat exchanger provided with corrugated fins having no louvers.

Further, because the introduction area in the corrugated fin 3 is much larger than that in the conventional heat exchanger, dust or the like do not tend to choke in the corrugated fin 3.

SECOND EMBODIMENT

Figure 4:
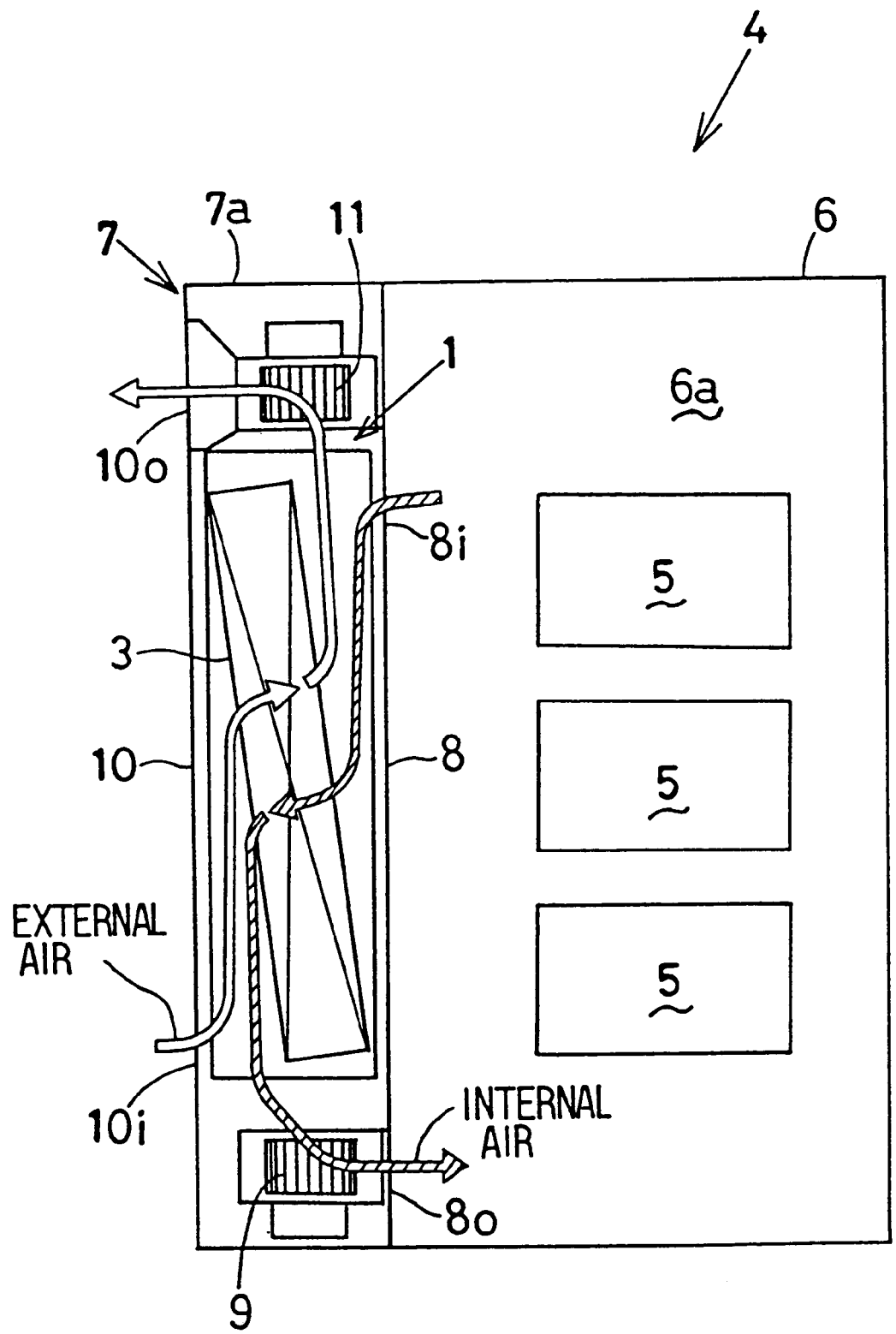
FIG. 4 is a schematic view showing a box-type cooling unit according to a second embodiment.

FIG. 4 is a schematic view showing a box-type cooling unit 4 within which the heat exchanger 1 in the first embodiment is installed.

The box-type cooling unit 3 is disposed indoors where it is not exposed to the weather, and includes a housing 6 and a cooling apparatus 7. The housing 6 constructs a sealed space 6a where a heat emitter 5 is disposed. The cooling apparatus 7 cools an inside of the sealed space 6a. The cooling apparatus 7 and the housing 6 are partitioned from each other by a partition plate 8.

The cooling apparatus 7 is disposed next to the housing 6. A casing 7a of the cooling apparatus 7 is formed into a rectangular parallelopipe-shape along the side surface of the housing 6. Here, the casing 7a is integrated with the housing 6, however the casing 7a may be formed independently with the housing 6 and attached at the inside or outside of the housing 6 instead.

The heat exchanger 1 is used in the cooling apparatus 7. An internal air inlet Bi is formed at the upper portion of the partition wall 8. The internal air inlet 8i introduces a high temperature air (internal air) in the sealed space 6a into the first fluid inlet Ai of the heat exchanger 1. An internal air outlet 8o is formed at the lower portion of the partition wall 8. The internal air outlet 8o returns the internal air having passed through the first fluid passage A into the sealed space 6a.

An internal air fan 9 is provided at the lower side of the cooling apparatus 7. The internal air fan 9 suctions and introduces the high temperature internal air in the upper portion of the sealed space 6a from the internal air inlet 8i into the first fluid passage A, and discharges the air having passed through the first fluid passage A into the lower portion of the sealed space 6a via the internal air outlet 8o. An arrow in FIG. 4 denotes an air flow generated by the internal air fan 9.

An external air inlet 10i is formed at the lower position of the front-panel 10 (left side in FIG. 4). The external air inlet 10i introduces the low temperature air outside the room (external air) into the second fluid inlet Bi of the heat exchanger 1. An external air outlet 10o is formed at the upper position of the front-panel 10. The external air outlet 10o discharges the air having passed through the second fluid passage B out of the box-type cooling unit 4.

An external air fan 11 is provided at the upper side of the cooling apparatus 7. The external air fan 11 suctions and introduces the low temperature external air from the external air inlet 10i into the second fluid passage B, and discharges the air having passed through the second fluid passage B out of the box-type cooling apparatus 7 through the external air outlet 10o. An arrow in FIG. 4 denotes an air flow generated by the external air fan 11.

When the heat emitter 5 operates, the internal air fan 9 and the external air fan 11 also operates. When the internal air fan 9 operates, the high temperature internal air passes through the first fluid passage A, and flows into the lower portion of the sealed space 6a. When the external air fan 11 operates, the low temperature external air passes through the second fluid passage B, and flows out of the box-type cooling unit 4.

In the heat exchanger 1, the first fluid flows in the first fluid passage A and the second fluid flows in the second fluid passage B. These fluids flow in opposite directions to each other while passing through the corrugated fins 3. At this time, the first fluid heat exchanges with the second fluid through the corrugated fin 3 and the partition wall 2. As a result, the heat in the sealed space 6a is discharged out of the sealed space 6a, thereby suppressing inside temperature of the sealed space 6a from increasing.

In the second embodiment, because the heat exchanger 1 in which the pressure loss of the air is low is employed, the internal air fan 9 and the external air fan 11 can be downsized, and power for driving them can be reduced. Further, the flow amounts of the high temperature internal air and the low temperature external air increase, thereby improving the heat exchanging efficiency.

THIRD EMBODIMENT

Figure 5A:
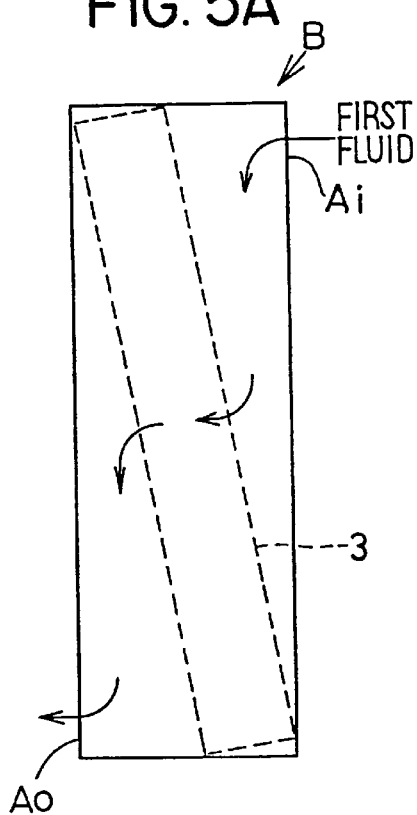
FIG. 5A is a schematic view showing a flow of a first fluid in a third embodiment.
Figure 5B:
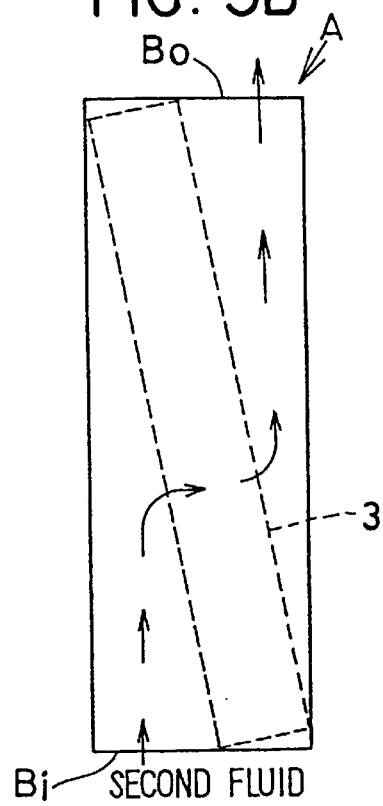
FIG. 5B is a schematic view showing a flow of a second fluid in a third embodiment.

According to a third embodiment, as shown in FIGS. 5A and 5B, the first fluid inlet Ai is formed at the back side upper position of the first fluid passage A, and the first fluid outlet Ao is formed at the front side lower position thereof. The second fluid inlet Bi is formed in the lower surface of the second fluid passage B, and the second fluid outlet Bo is formed in the upper surface thereof.

Here, the first fluid inlet Ai may be formed at the front side lower position of the first fluid passage A, and the first fluid outlet Ao may be formed at the back side upper position thereof instead. In a similar way, the second fluid inlet Bi may be formed in the upper surface of the second fluid passage B, and the second fluid outlet Bo may be formed in the lower surface thereof instead.

FOURTH EMBODIMENT

Figure 6A:
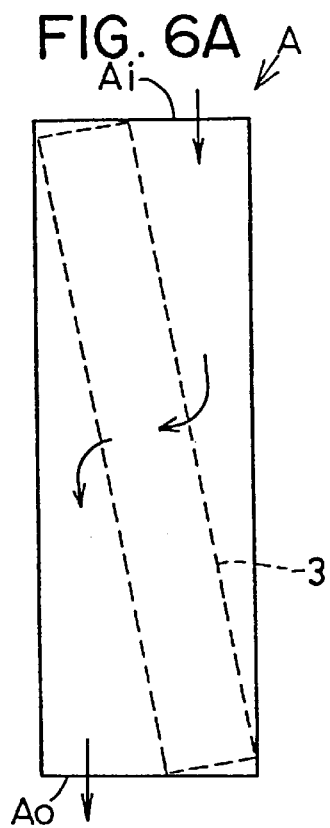
FIG. 6A is a schematic view showing a flow of a first fluid in a fourth embodiment.
Figure 6B:
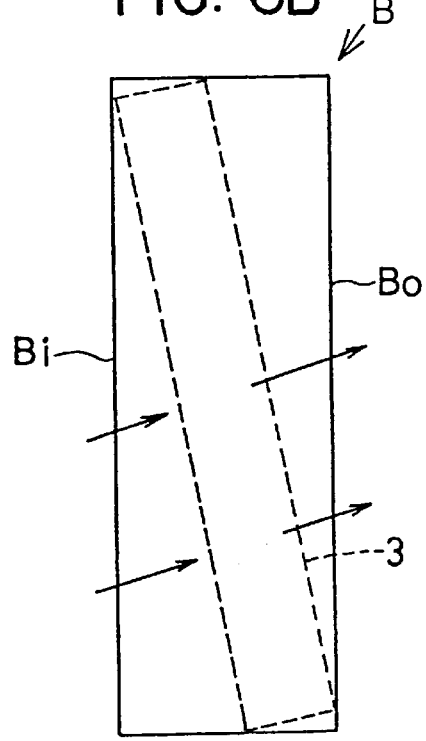
FIG. 6B is a schematic view showing a flow of a second fluid in a fourth embodiment.

According to a fourth embodiment, as shown in FIGS. 6A and 6B, the first fluid inlet Ai is formed in the upper surface of the first fluid passage A, and the first fluid outlet Ao is formed in the lower surface thereof. The second fluid inlet Bi is formed in the front side surface of the second fluid passage B, and the second fluid outlet Bo is formed in the back side surface thereof.

Here, the first fluid inlet Ai may be formed in the lower surface of the first fluid passage A, and the first fluid outlet Ao may be formed in the upper surface thereof instead. In a similar way, the second fluid inlet Bi may be formed in the back side surface of the second fluid passage B, and the second fluid outlet Bo may be formed in the front side surface thereof instead.

FIFTH EMBODIMENT

Figure 7:
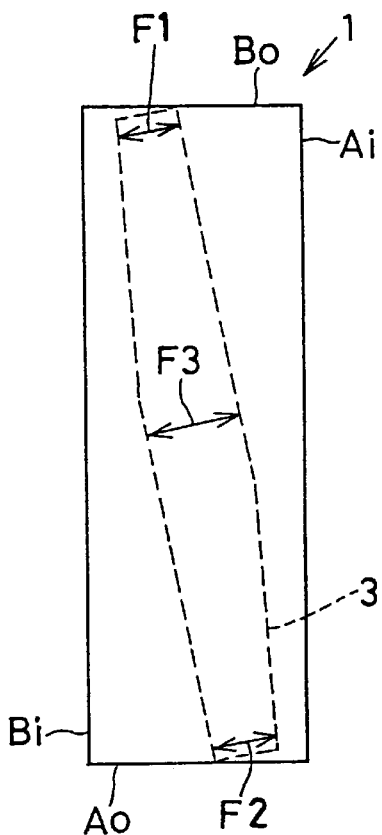
FIG. 7 is a schematic view showing a side shape of a corrugated fin according to a fifth embodiment.

According to a fifth embodiment, as shown in FIG. 7, the fin widths F1, F2 at the sides of the fluid inlets Ai, Bi and fluid outlets Ao, Bo are shorter than the fin width F3 at the center region of the corrugated fin 3.

Thereby, spaces where the corrugated fin 3 occupies becomes small at the sides of the fluid inlets Ai, Bi and fluid outlets Ao, Bo in the fluid passages A, B. Thus, fluid introducing resistance and fluid discharging resistance becomes small, and the pressure losses of the fluids in the fluid passages A, B can be suppressed further lower than that in the first through fourth embodiments.

SIXTH EMBODIMENT

Figure 8:
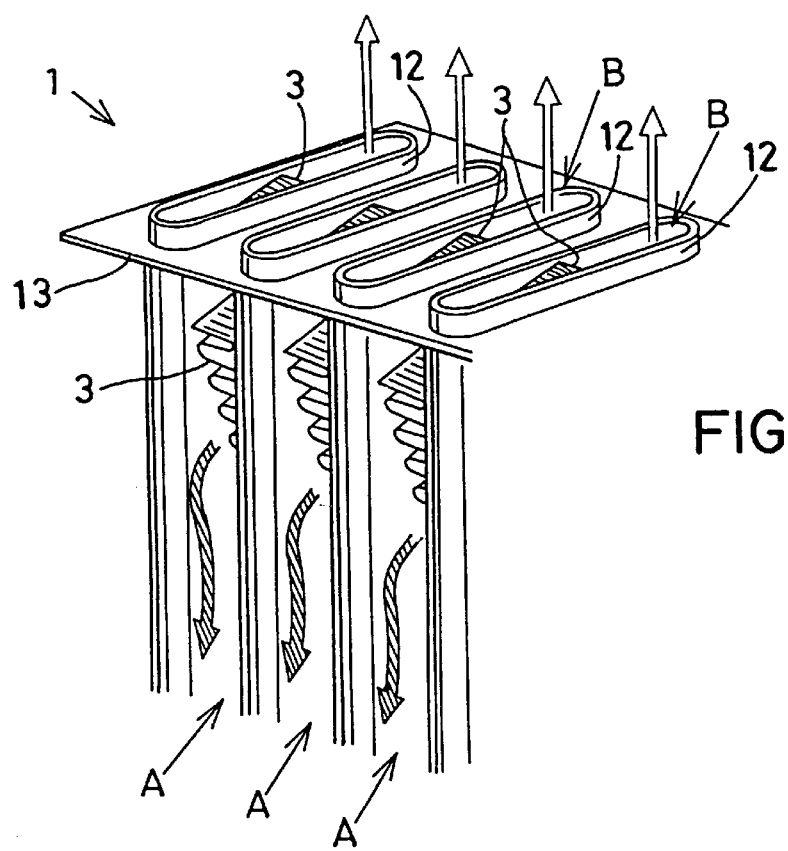
FIG. 8 is a principal perspective view showing a heat exchanger according to a sixth embodiment.

According to a sixth embodiment, as shown in FIG. 8, the second fluid passage B is constructed by plural flat tubes 12, and the corrugated fin 3 is disposed diagonally inside each flat tube 12. Here, the tube 12 performs as the partition wall 2 in the first through fifth embodiments.

As shown in FIG. 8, a flange 13 is provided at the opening area of each tube 12 for partitioning the second fluid flowing through the tube 12 from the first fluid flowing between the adjacent tubes 12. Here, each tube 12 penetrates the flange 13.

In this way, the second fluid passage B is constructed by the tube 12, and the flange 13 partitions the first fluid from the second fluid. Thus, the first fluid and the second fluid are easily prevented from mixing with each other. For example, when the external air flows through the tube 12, and the tube 12 is employed within the box-type cooling unit 4 in FIG. 4, wind, rain, dust and the like are easily prevented from flowing into the housing 6 by only providing a sealing structure at the connecting portion between the tube 12 and the flange 13.

Here, alternatively, the first fluid passage A may be constructed by the flat tube 12, and the corrugated fin 3 may be disposed diagonally inside the tube 12.

Further, the corrugated fin 3 inside the tube 12 may be eliminated, and any fluid (for example, liquid or refrigerant etc.) other than air may be flow through the tube 12.

SEVENTH EMBODIMENT

Figure 9:
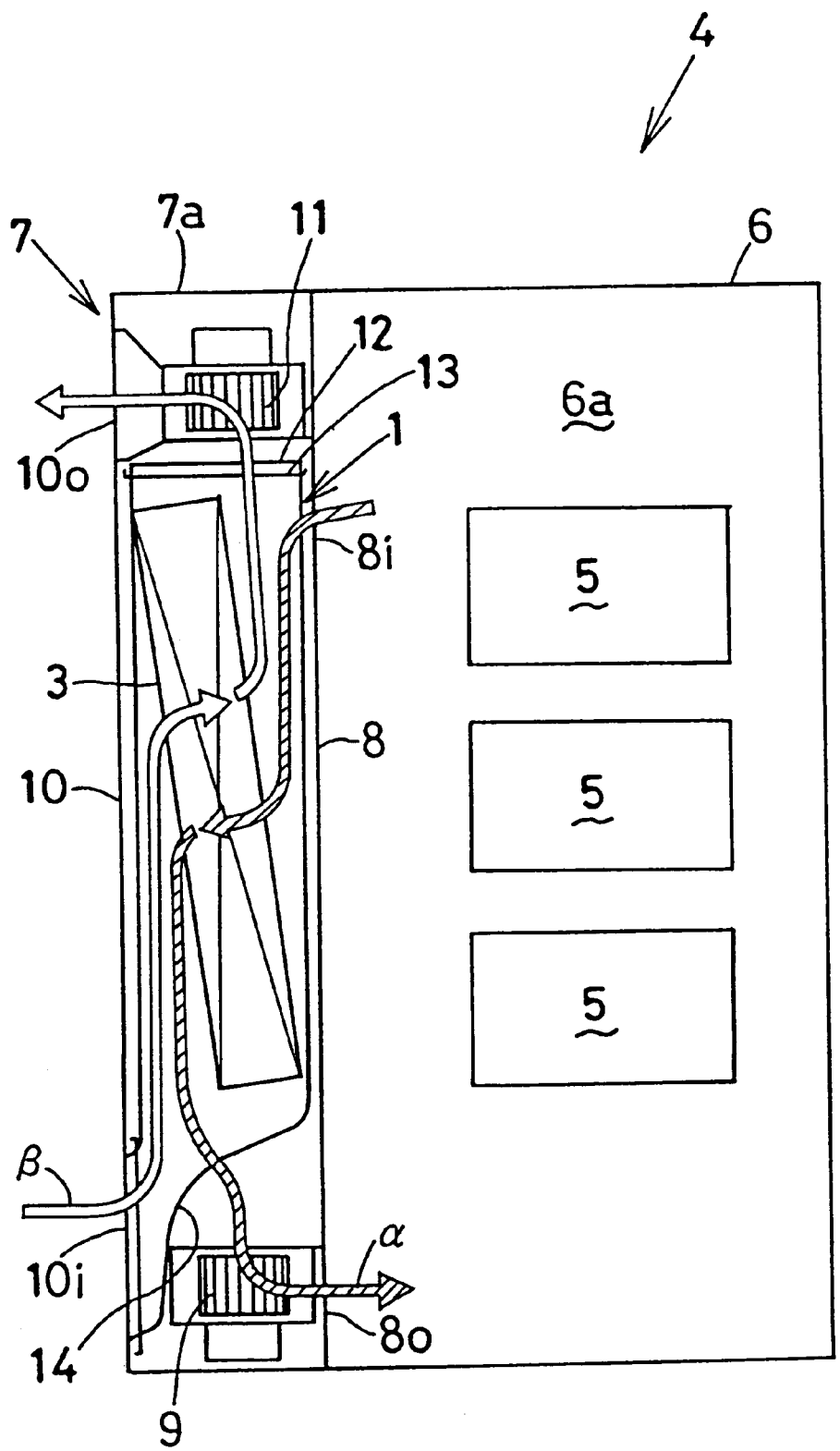
FIG. 9 is a schematic view showing a box-type cooling unit according to a seventh embodiment.

According to a seventh embodiment, as shown in FIG. 9, the box-type cooling unit 4 is disposed outdoors where it is exposed to the weather. A duct 14 is provided for introducing the low temperature external air to the lower end of the tube 12.

In the seventh embodiment, the low temperature external air flows through the tube 12, and the flange 13 partitions the low temperature external air from the high temperature internal air. Thus, waterproof performance of the box-type cooling unit 4 is attained, and dust or the like is prevented from intruding into the housing 6.

EIGHTH EMBODIMENT

Figure 10A:
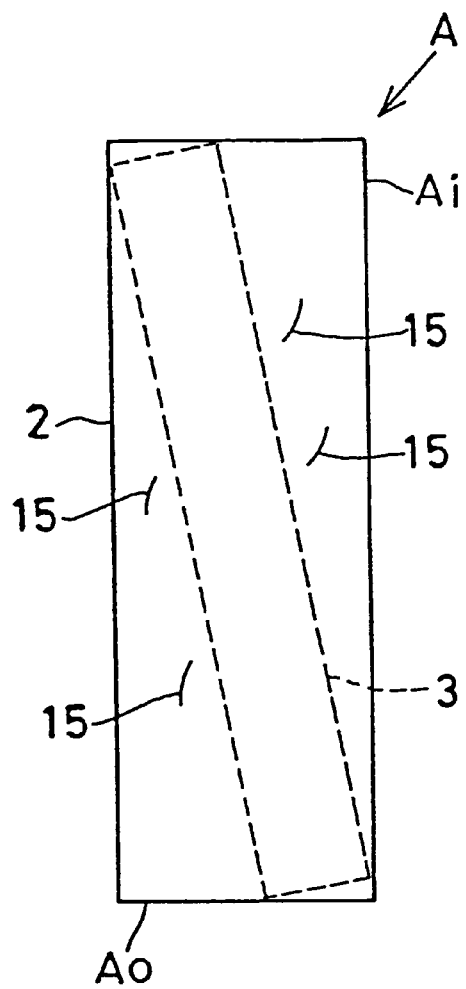
FIG. 10A is a schematic view showing a first fluid passage according to an eighth embodiment.
Figure 10B:
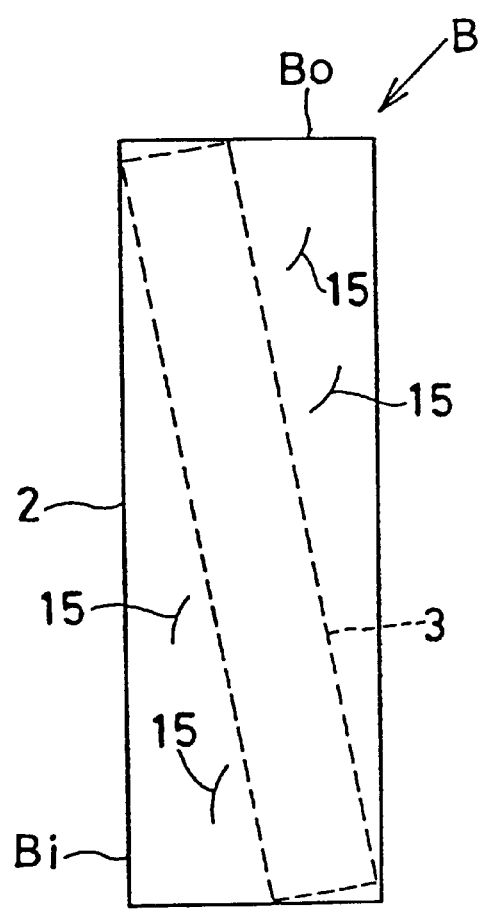
FIG. 10B is a schematic view showing a second fluid passage according to the eighth embodiment.

According to an eighth embodiment, as shown in FIGS. 10A and 10B, rectifier members 15 are provided in the first and second fluid passages A, B for rectifying the fluid-flow.

The rectifier member 15 is constructed by a plate connected to the partition wall 2, a protrusion member connected to the partition wall 2, or a dimple press-formed on the partition wall 2.

In the eighth embodiment, as the rectifier members 15 are provided in the first and second fluid passages A, B, the first and second fluid flow laminarly, thereby decreasing the pressure loss of the fluids in the fluid passages A, B. As a result, flow amounts of the first and second fluids increases, and heat exchanging performance of the heat exchanger 1 is improved. Further, fluid feeding apparatuses for feeding the first and second fluids such as a blower fan can be downsized, and power for driving the fluid feeding apparatus can be reduced.

In the eighth embodiment, the fluids become laminar flows due to the rectifier member 15. Alternatively, the rectifier may be provided for diffusing the fluid-flow.

The rectifier members 15 of the partition walls 2 adjacent to each other may make contact with each other. That is, the rectifier member 15 adjacent to each other are brazed with each other, thereby increasing the rigidity of the heat exchanger 1.

Further, the rectifier member 15 may be used to set the corrugated fin 3 at an appropriate position. Thereby, an assembling performance of the heat exchanger 1 is improved.

NINTH EMBODIMENT

Figure 11A:
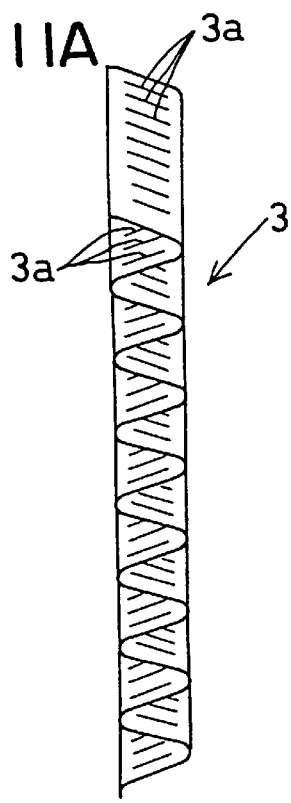
FIG. 11A is a side view showing a corrugated fin according to a ninth embodiment.
Figure 11B:
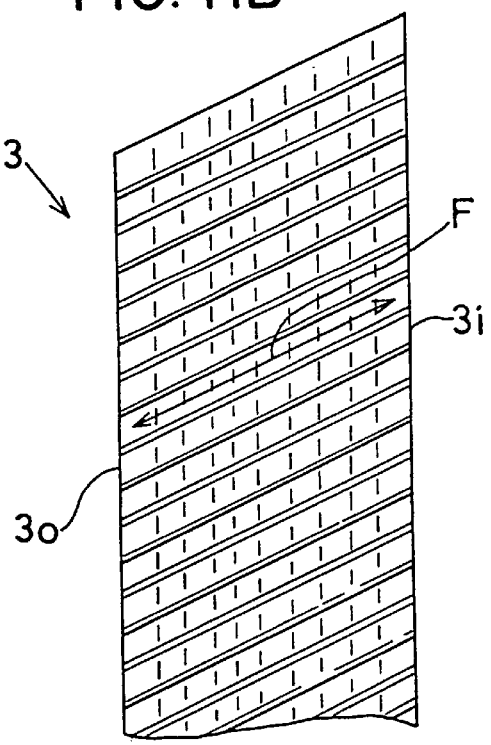
FIG. 11B is a plan view showing the corrugated fin according to the ninth embodiment.
Figure 12:
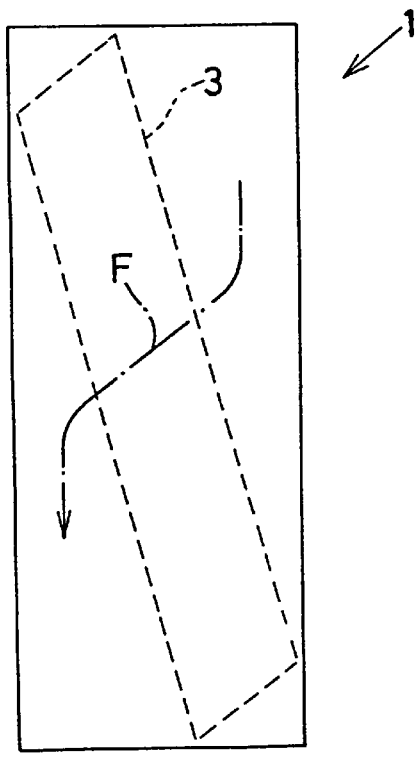
FIG. 12 is a schematic view showing a flow of a fluid in the ninth embodiment.

According to a ninth embodiment, as shown in FIGS. 11A, 11B and 12, the corrugated fin 3 is formed in such a manner that a fluid-flow direction F in the corrugated fin 3 inclined with respect to the fluid inlet side end 3i and fluid outlet side end 3o. That is, the fluid-flow direction F is almost along a real fluid-flow direction.

Thereby, the fluid flows smoothly from the fluid inlet Ai, Bi, to the corrugated fin 3. Thus, the pressure loss of the fluid is suppressed low, thereby improving the heat exchanging efficiency.

The corrugated fin 3 in the present embodiment may be employed within the box-type cooling unit 4 described above.

TENTH EMBODIMENT

Figure 14:
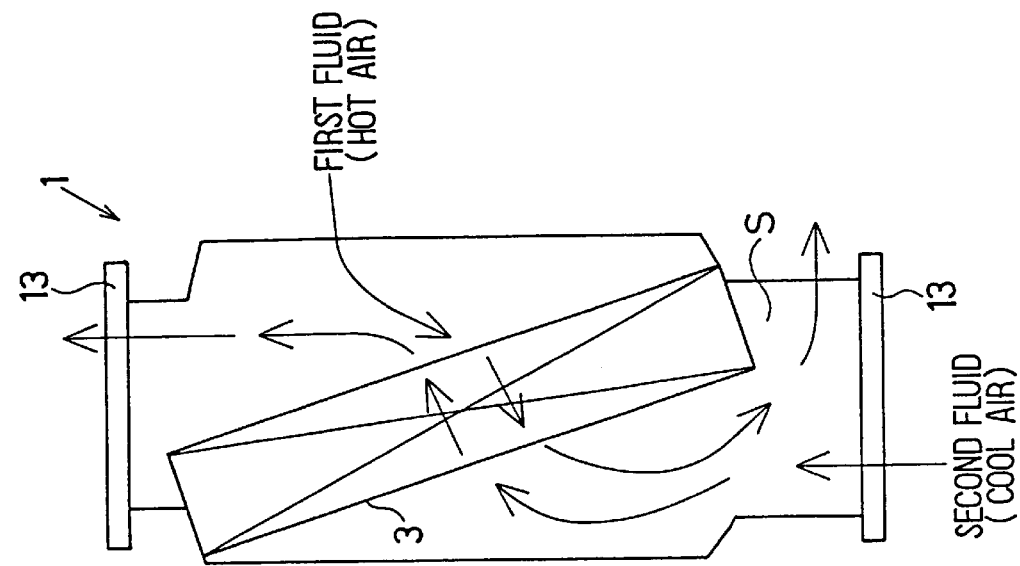
FIG. 14 is a schematic view showing flows of fluids in the tenth embodiment.
Figure 13:
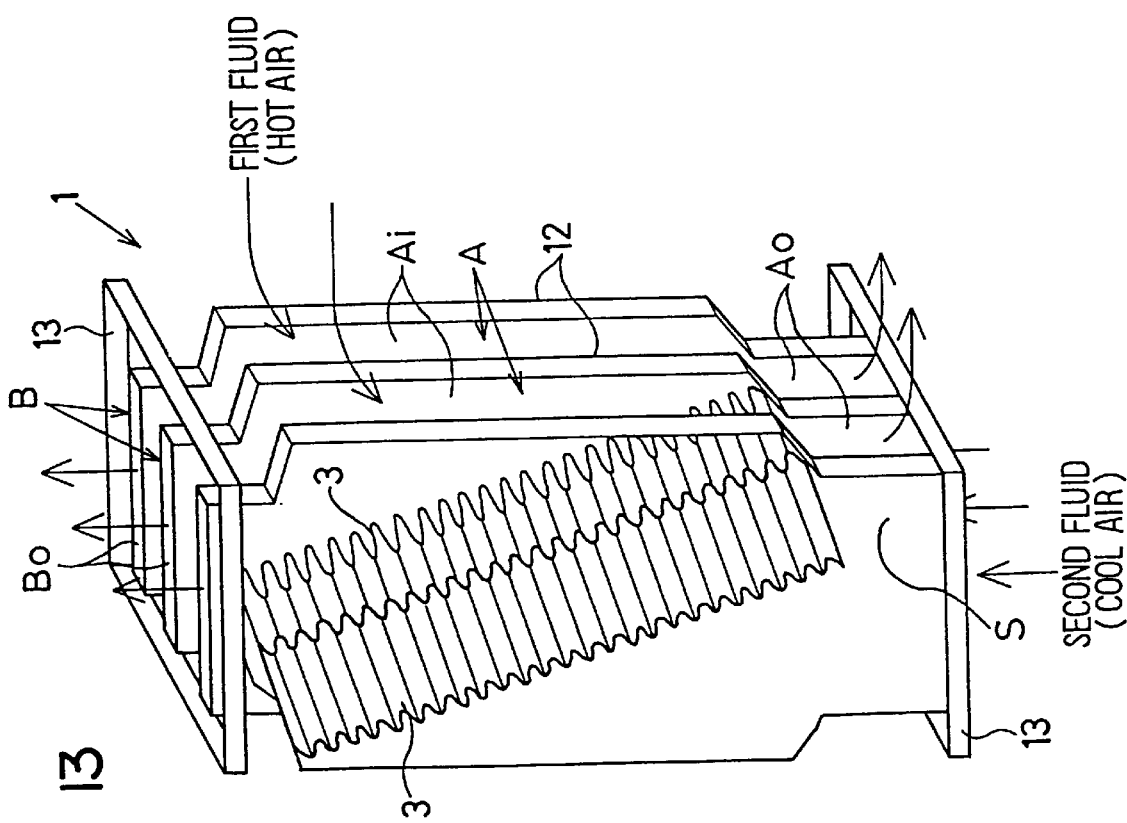
FIG. 13 is a perspective view showing a heat exchanger according to a tenth embodiment.
Figure 15:
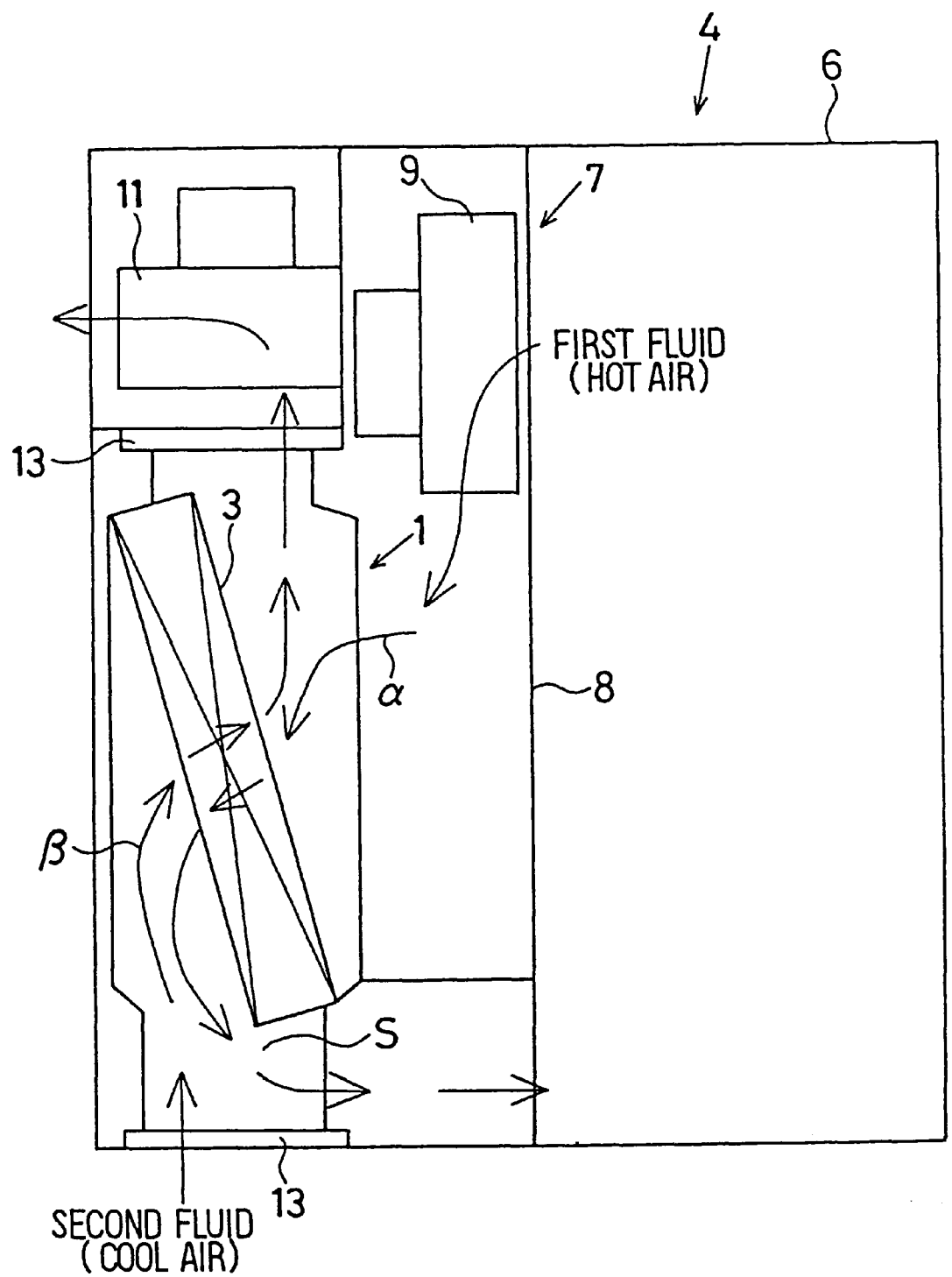
FIG. 15 is a schematic view showing a box-type cooling unit according to the tenth embodiment.

According to a tenth embodiment, as shown in FIGS. 13–15, the second fluid passage B is, as in the sixth embodiment, constructed by the flat tube 12, and the corrugated fin 3 is diagonally disposed inside the tube 12. The first fluid passage A is formed between each pair of adjacent flat tubes 2.

In the tenth embodiment, both first fluid inlet Ai and outlet Ao are provided at one side of the first fluid passage A. Thereby, the first fluid U-turns in the heat exchanger 1, and the first fluid flows out of the heat exchanger 1 at the same side where the first fluid flows in.

In the tenth embodiment, the first fluid inlet Ai is formed at the upper position of the first fluid passage A, while the first fluid outlet is provided at the lower position of the first fluid passage A. Further, as shown in FIG. 14, the corrugated fin 3 is disposed inside the heat exchanger 1 in such a manner that the upper end thereof inclines toward the left side. Whereby, there needs a space S under the first fluid passage A where the first fluid having passed through the corrugated fin 3 U-turns. Therefore, in the present embodiment, the corrugated fin 3 is disposed at the upper side in the first fluid passage A for providing the space S under the corrugated fin 3. Here, in the second fluid passage B, the corrugated fin 3 is disposed at the upper side for corresponding to the corrugated fin 3 in the first fluid passage A.

In the tenth embodiment, the second fluid passage B is constructed by tubes 12 formed by connecting a pair of plates facing each other at the outer peripheries thereof. Each tube 12 is integrally brazed with the other components of the heat exchanger 1. The plate forming the tube 12 is, as shown in FIG. 14, formed symmetrically with respect to a center line extending in the longitudinal direction thereof. Thus, only one kind of plate is needed for forming the tube 12, thereby suppressing the manufacturing cost of the heat exchanger 1. Further, in the present embodiment, the second fluid inlet and outlet Bi, Bo open at the center positions of the upper and lower surfaces in the length direction of the heat exchanger 1. Thereby, the opening area of the second fluid inlet and outlet Bi, Bo can be enlarged, then fluid passing resistance at the inlet and outlet Bi, Bo can be decreased.

Here, in the cooling apparatus 7 including the heat exchanger 1 according to the tenth embodiment, as shown in FIG. 15, both internal air fan 9 and external air fan 11 are disposed at the upper position.

ELEVENTH EMBODIMENT

Figure 16:
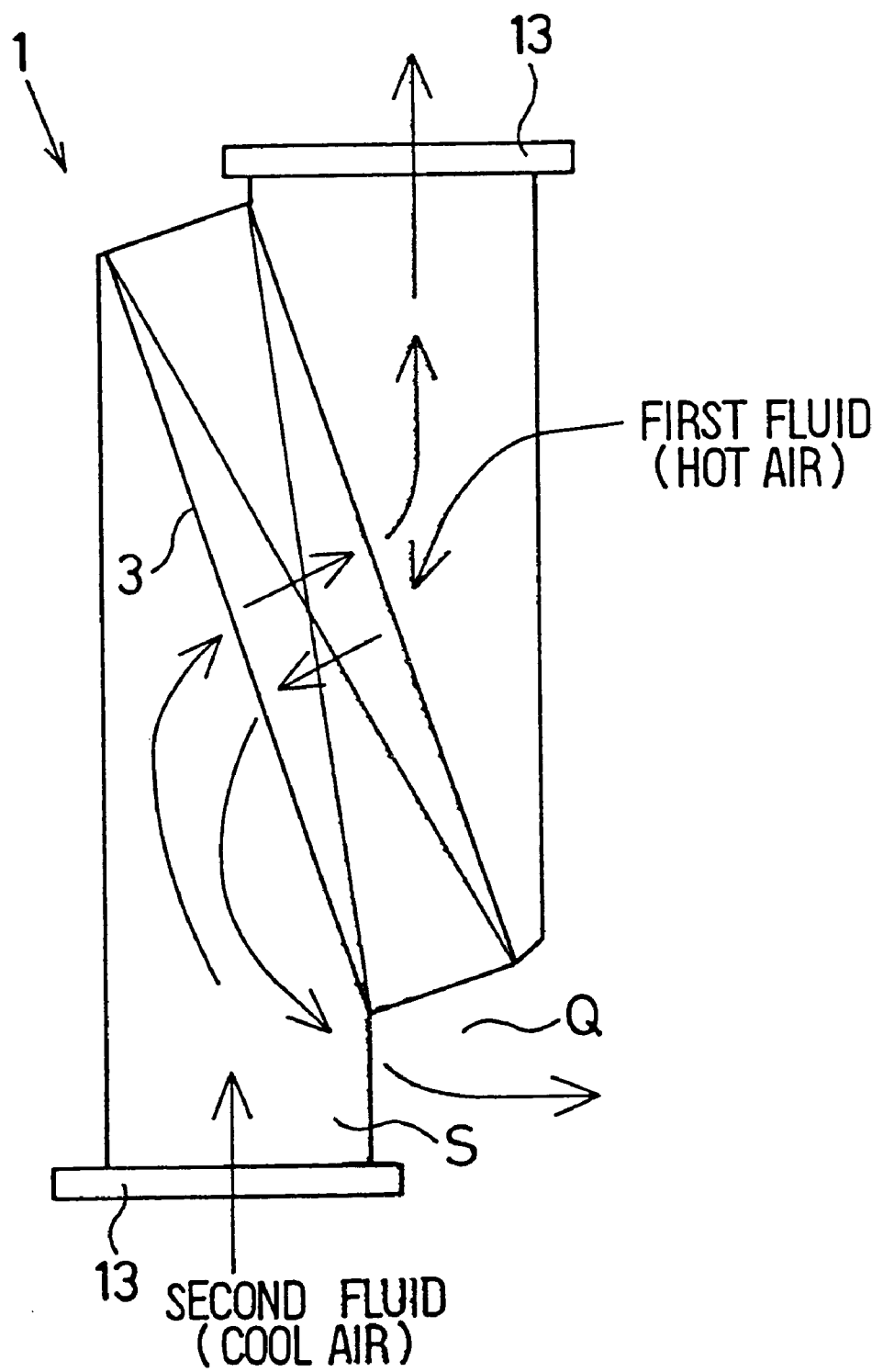
FIG. 16 is a schematic view showing flows of fluid in an eleventh embodiment.
Figure 17:
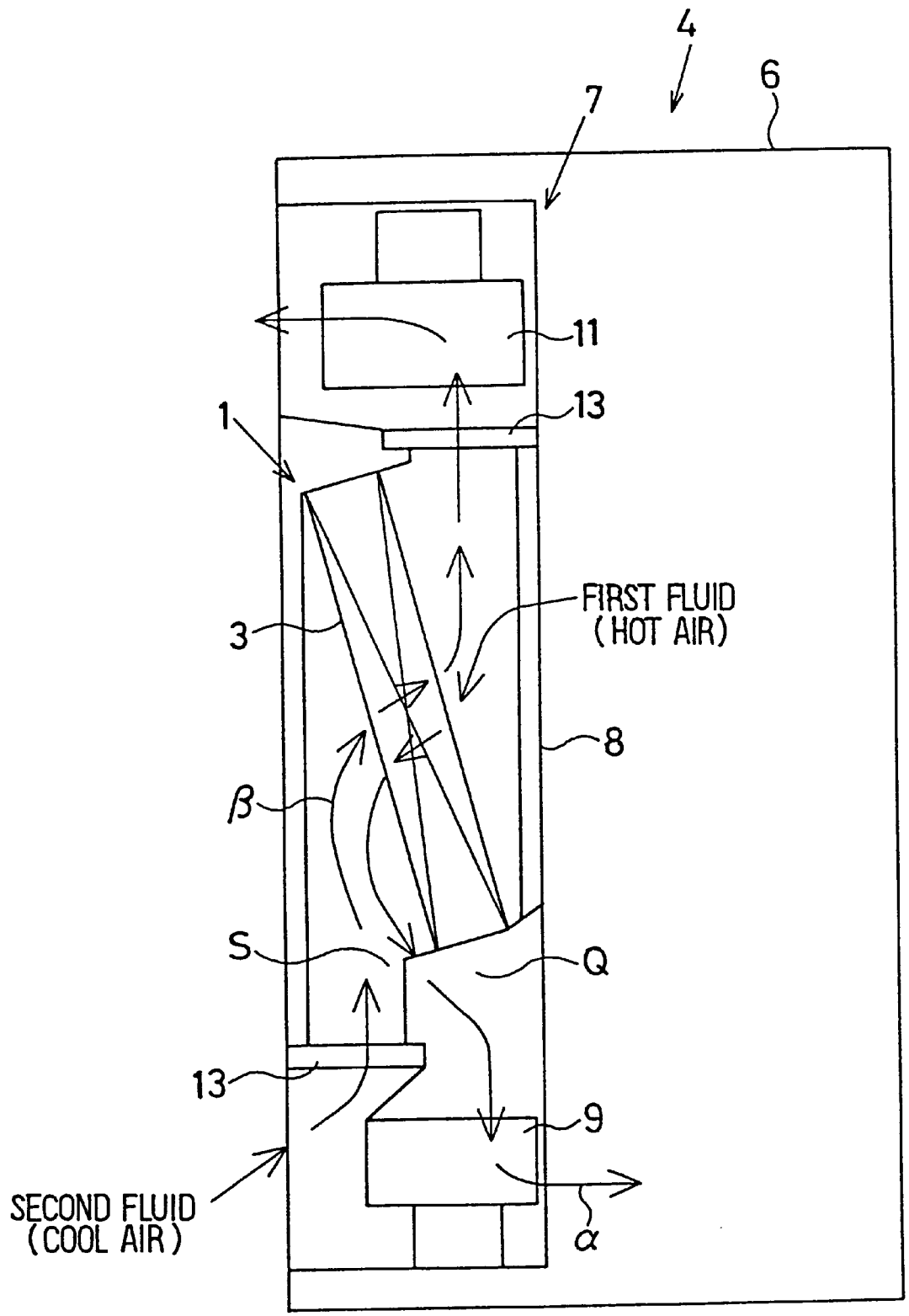
FIG. 17 is a schematic view showing a box-type cooling unit according to the eleventh embodiment.

According to an eleventh embodiment, as shown in FIGS. 16 and 17, the first fluid inlet and outlet Ai, Ao are formed at one side of the first fluid passage A as in the tenth embodiment. The internal air fan 9 is disposed under the heat exchanger 1. The first fluid passage A is made narrow at the side of the first fluid outlet Ao for introducing the first fluid having passed through the heat exchanger 1 into the internal air fan 9 side. Further, a space Q is provided at the side of the narrowed first fluid passage A for leading the fluid flow downwardly. Here, the second fluid passage B is also made narrow at the side of the second fluid outlet Bo formed in the upper flange 13.

In this way, the internal air fan 9 is disposed under the heat exchanger 1, and the external air fan 11 is disposed above the heat exchanger 1, thus the cooling apparatus 7 can be downsized, thereby improving a installing performance thereof into the housing 6.

TWELFTH EMBODIMENT

Figure 18:
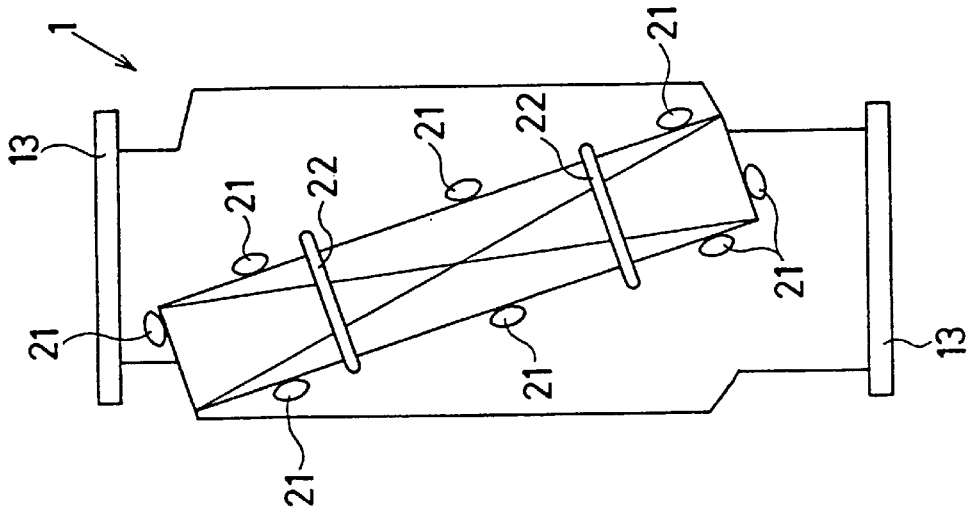
FIG. 18 is a schematic view showing a heat exchanger according to a twelfth embodiment.

According to a twelfth embodiment, as shown in FIG. 18, plural projections 21 are provided on the plate forming the tube 12 for setting position of the corrugated fin 3.

The projections 21 contact the outer periphery of the corrugated fin 3 to restrict the movement of the corrugated fin 3 before being brazed. The projections 21 are made of plural small dimples.

Therefore, the position of the corrugated fin 3 is set by the projections 21, thereby improving the assembling performance of the heat exchanger 1. As a result, a high accuracy heat exchanger 1 can be manufactured.

THIRTEENTH EMBODIMENT

Figure 19:
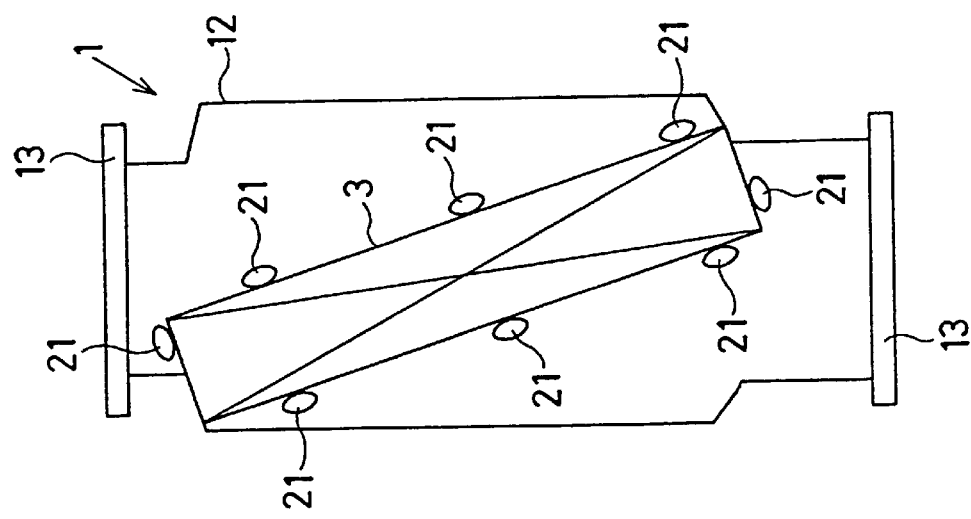
FIG. 19 is a schematic view showing a heat exchanger according to a thirteenth embodiment.
Figure 20:
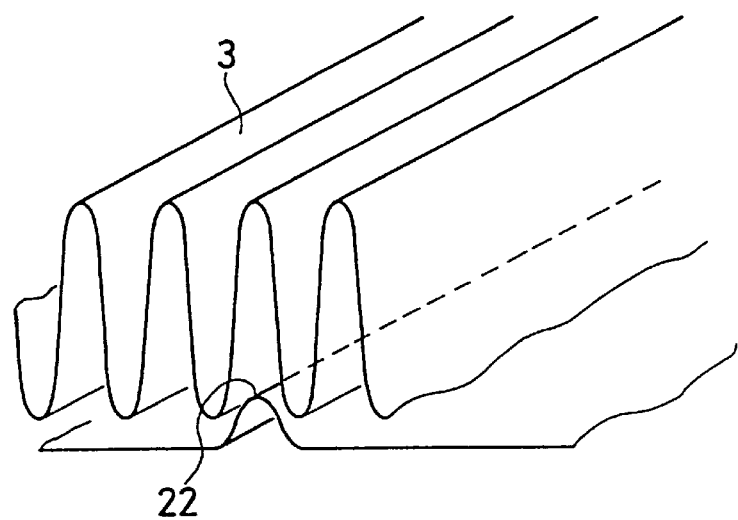
FIG. 20 is a perspective view showing a projection along a groove of a corrugated fin according to the thirteenth embodiment.

According to a thirteenth embodiment, as shown in FIGS. 19 and 20, adding to the first projections 21 in the twelfth embodiment, second projections 22 are provided along the grooves of the corrugated fin 3 for setting the position of the corrugated fin 3. Thus, the position of the corrugated fin 3 is set more accurately.

FOURTEENTH EMBODIMENT

Figure 21:
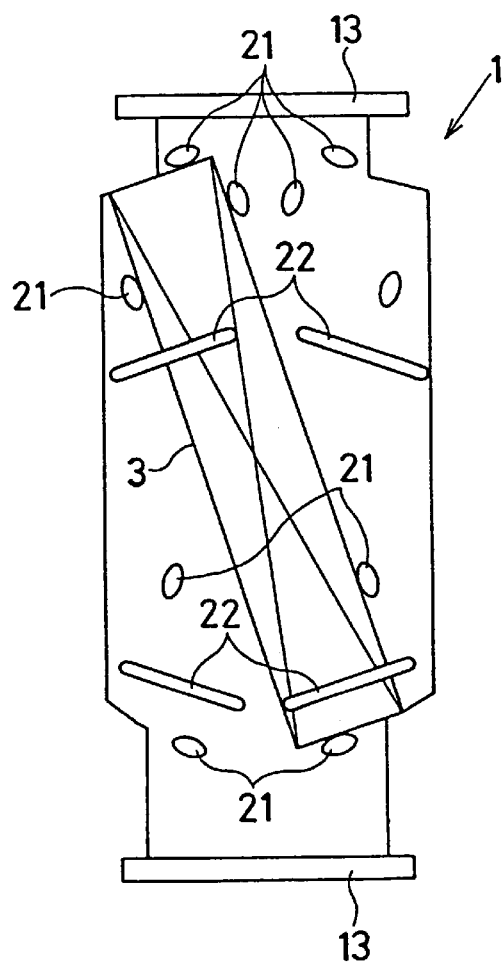
FIG. 21 is a schematic view showing a heat exchanger according to fourteenth embodiment.

According to a fourteenth embodiment, as shown in FIG. 21, the first projections 21 are provided at the outer periphery for the corrugated fin 3, and the second projections 22 are provided along the grooves of the corrugated fin 3, as in the thirteenth embodiment. Further, as in the tenth embodiment, the plate forming the tube 12 is formed symmetrically with respect to the central line in the length direction of the heat exchanger 1. Thus, also in the fourteenth embodiment, only one kind of plate is needed for forming the tube 12, thereby suppressing the manufacturing cost of the heat exchanger 1.

FIFTEENTH EMBODIMENT

Figure 22:
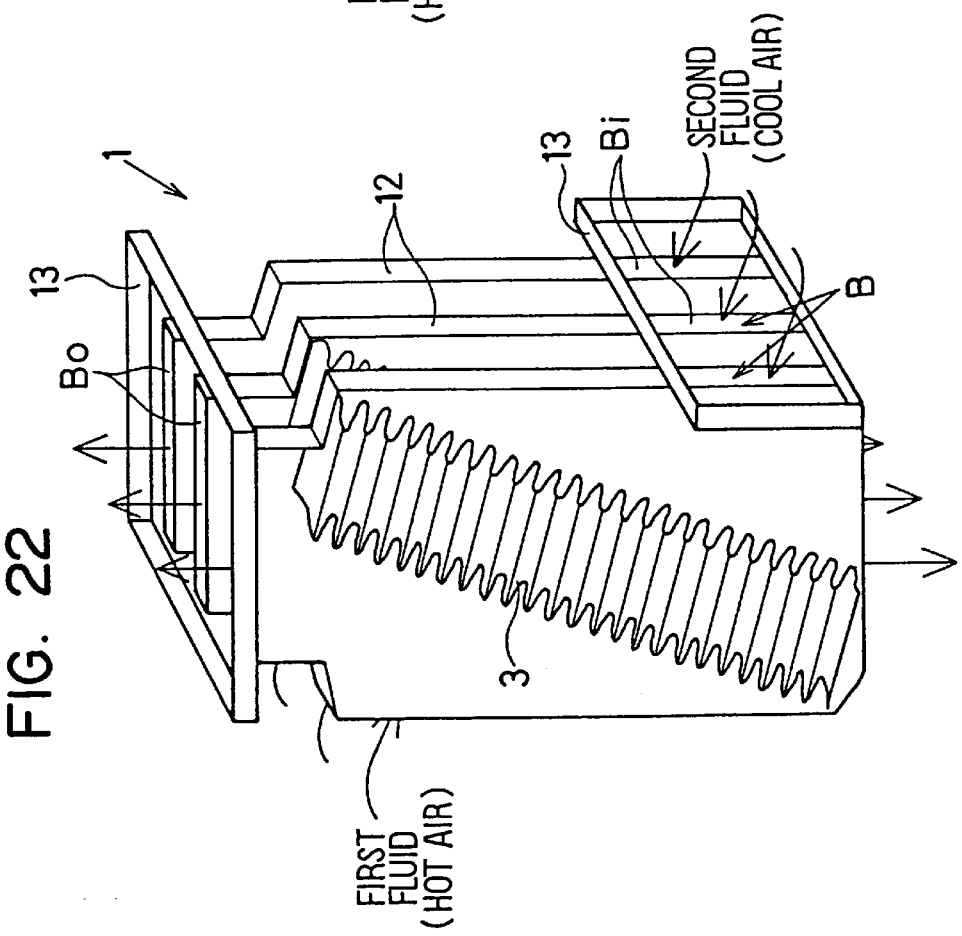
FIG. 22 is a perspective view showing a heat exchanger according to a fifteenth embodiment.

According to a fifteenth embodiment, as shown in FIG. 22, the first fluid inlet Ai is formed at the back side upper position of the heat exchanger 1, and the first fluid outlet Ao is formed at the lower surface thereof, as in the first embodiment. The second fluid inlet Bi is formed at the front side lower position of the heat exchanger 1, and the second fluid outlet Bo is formed at the upper surface thereof.

The second fluid passage B is constructed by the tubes 12 formed by connecting a pair of plates. The low temperature second fluid flows through the tube 12.

Here, the flange 13 introducing the second fluid into each tube 12 is provided at the upper side of the heat exchanger 1.

SIXTEENTH EMBODIMENT

Figure 23:
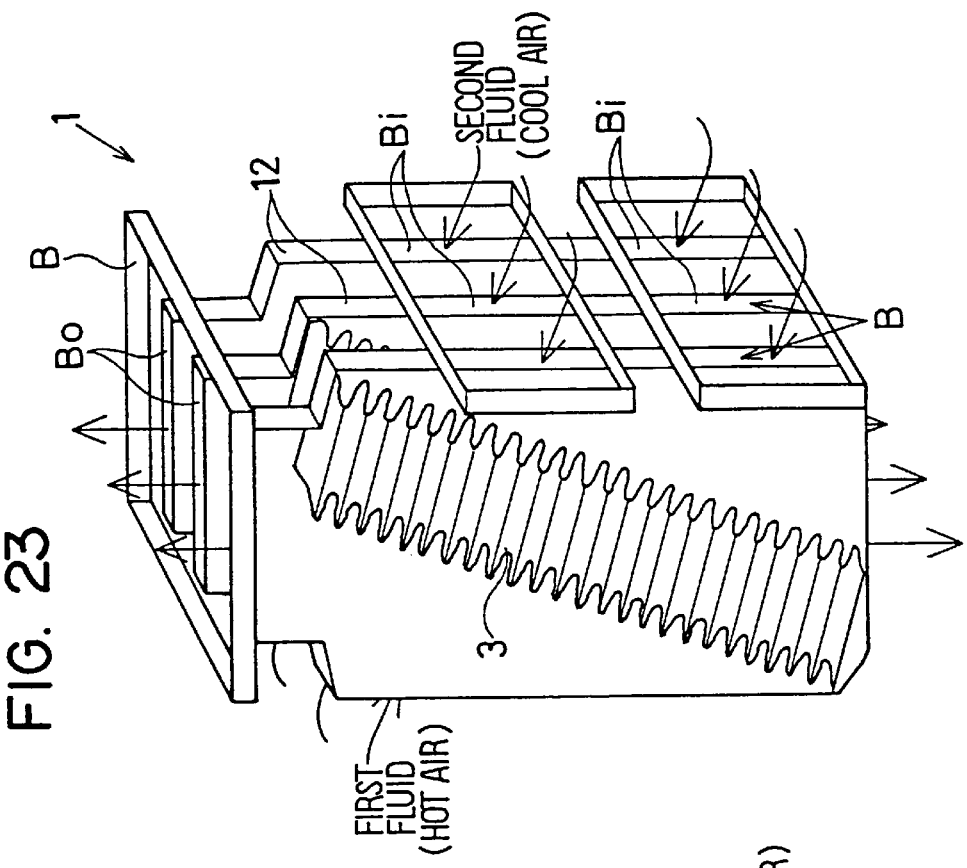
FIG. 23 is a perspective view showing a heat exchanger according to a sixteenth embodiment.
Figure 24:
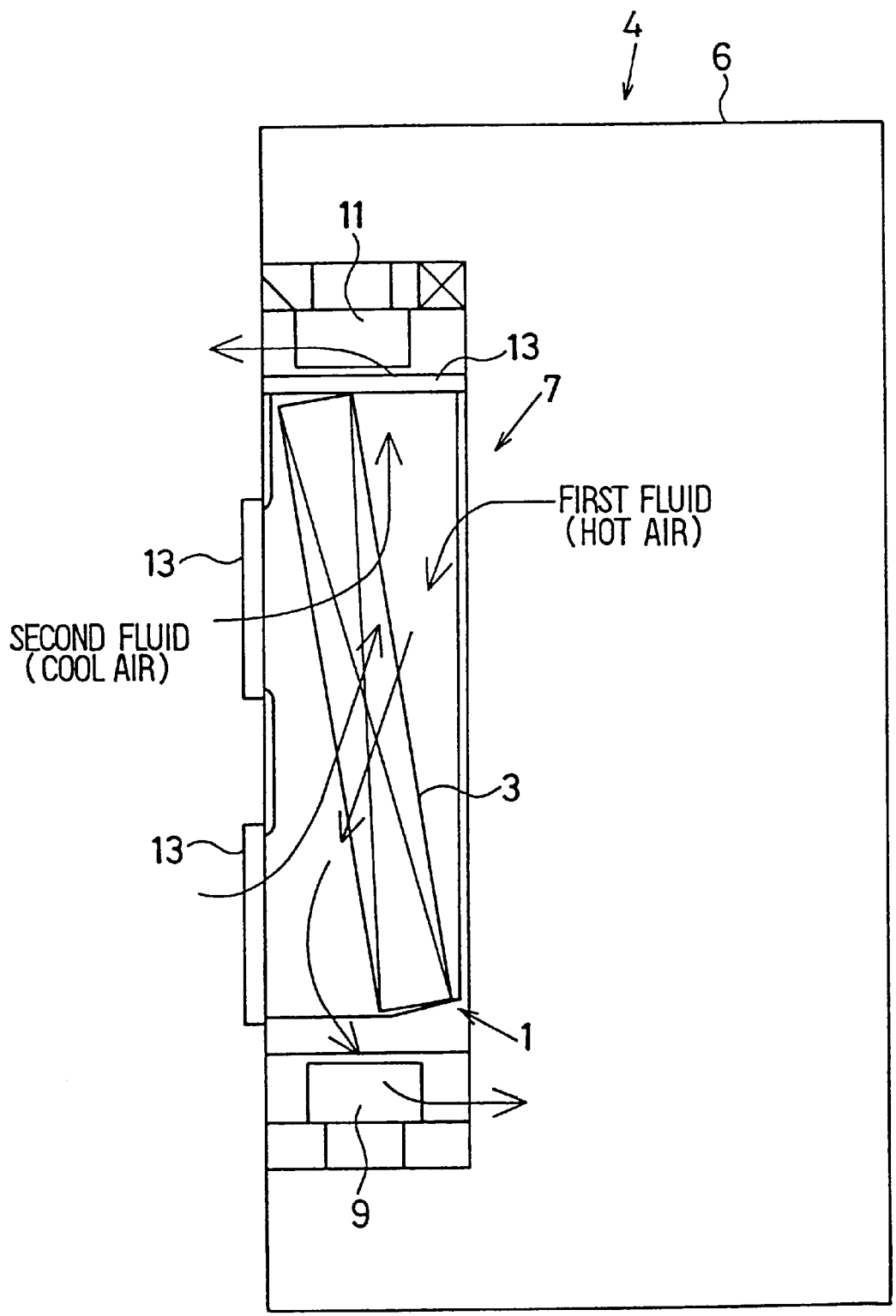
FIG. 24 is a schematic view showing a box-type cooling unit according to the sixteenth embodiment.

According to a sixteenth embodiment, as shown in FIGS. 23 and 24, adding to the heat exchanger 1 of the fifteenth embodiment, two flanges 13 are provided at the side of the heat exchanger 1.

When the longitudinal length of the heat exchanger 1 is much longer than the latitudinal length thereof, if a single large flange 13 is used for introducing the second fluid, the rigidity of the heat exchanger 1 decreases and the number of kinds of flange 13 increases. However, in the sixteenth embodiment, two flanges 13 are provided for introducing the second fluid, thereby avoiding the above-described problems. Further, the opening area of the second fluid inlet Bi is enlarged, thereby suppressing the passing resistance of the fluid.

Here, in the sixteenth embodiment, as shown in FIG. 24, the internal air fan 9 is disposed under the heat exchanger 1, for downsizing the cooling apparatus 7.

SEVENTEENTH EMBODIMENT

Figure 25:
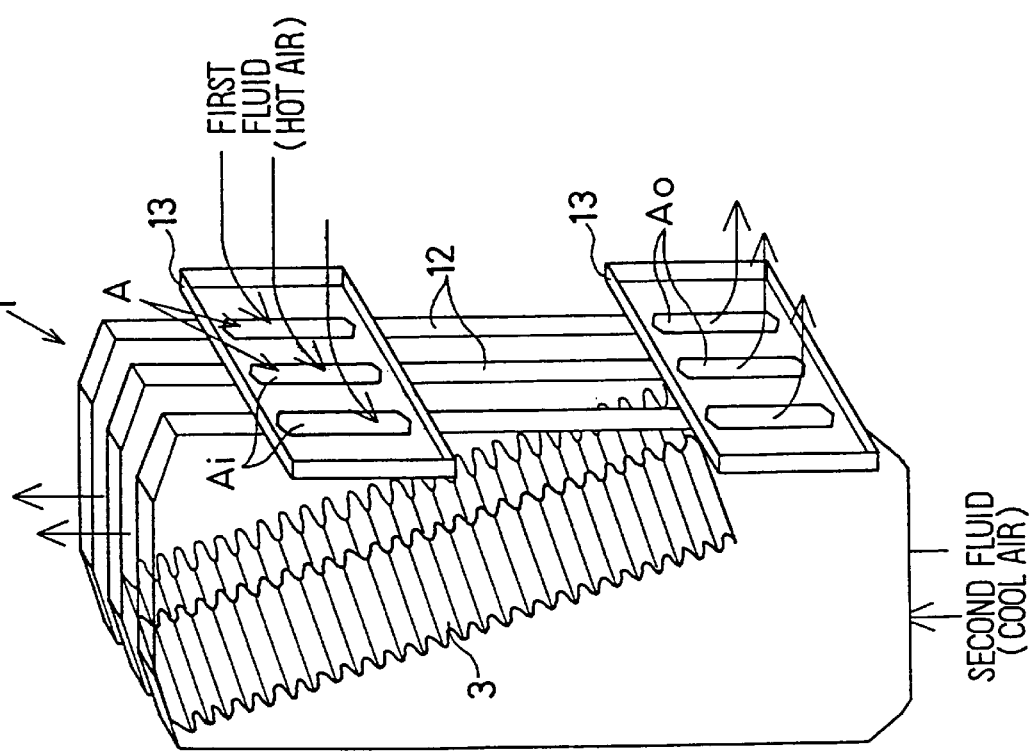
FIG. 25 is a perspective view showing a heat exchanger according to a seventeenth embodiment.

According to a seventeenth embodiment, as shown in FIG. 25, both first fluid inlet and first fluid outlet Ai, Ao are provided at one side of the first fluid passage A, as in the tenth embodiment. The high temperature first fluid flows through the tube 12. For this, two flanges 13 are provided at the same side of the heat exchanger 1 for introducing the first fluid into each tube 12 and discharging the first fluid having passed through each tube 12 out of the heat exchanger 1.

EIGHTEENTH EMBODIMENT

Figure 26:
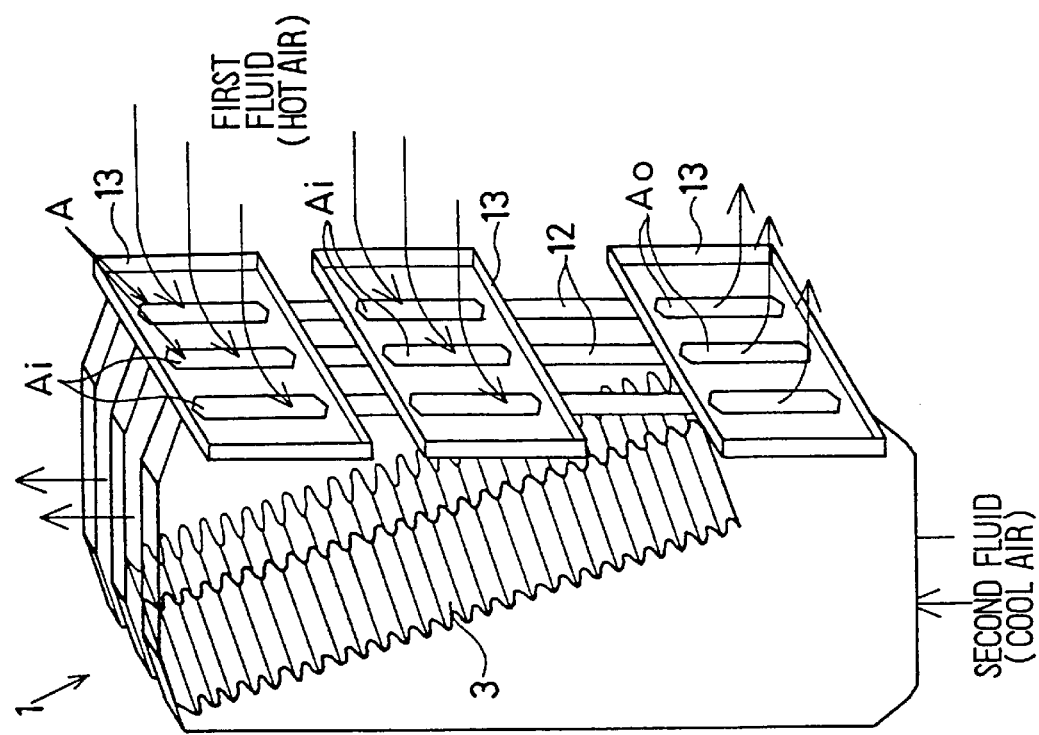
FIG. 26 is a perspective view showing a heat exchanger according to an eighteenth embodiment.

According to an eighteenth embodiment, as shown in FIG. 26, two flanges 13 introducing the first fluid into each tube 12 are provided at the same side of the heat exchanger 1, as in the sixteenth embodiment. Other structures are all the same as those in the seventeenth embodiment. Thereby, the same effects as in the sixteenth embodiment are attained.

NINETEENTH EMBODIMENT

Figure 27:
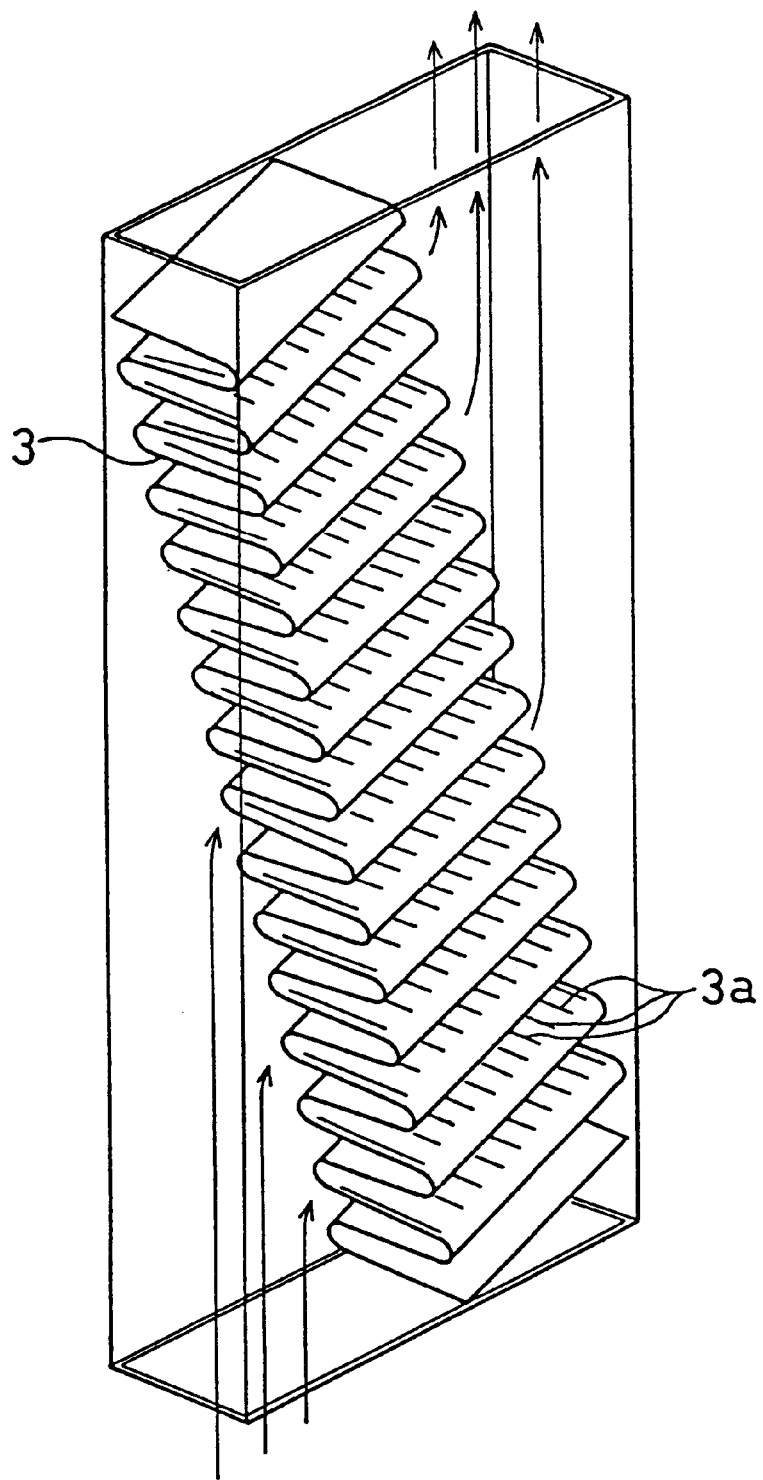
FIG. 27 is a perspective view showing a corrugated fin disposed inside a fluid passage in a nineteenth embodiment.

According to a nineteenth embodiment, as shown in FIG. 27, both end fin plates of the corrugated fin 3 are formed substantially flat to prevent the fluid from flowing through the fin plates. The flat portion of both end fin plates are made by, for example, squashing the louvers 3a of both end fin plates, or not forming the louvers 3a at both end fin plates, or putting seal members for covering the louvers 3a of both end fin plates.

TWENTIETH EMBODIMENT

Figure 28:
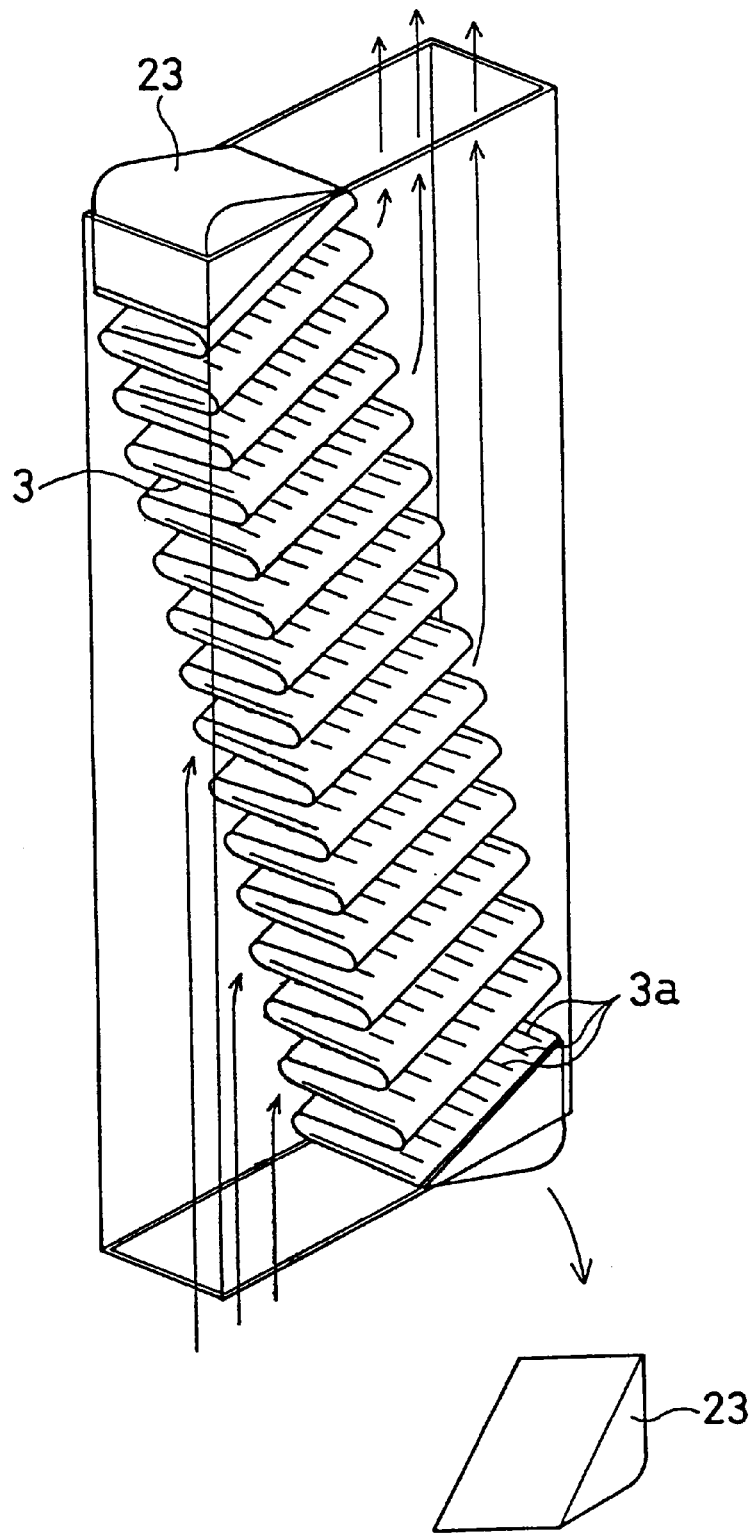
FIG. 28 is a perspective view showing a corrugated fin disposed inside a fluid passage in a twentieth embodiment.

According to a twentieth embodiment, as shown in FIG. 28, a rectifier members 23 are provided at both end fin plates of the corrugated fin 3 for covering the louvers 3a of both end fin plates. Thereby, as in the nineteenth embodiment, the fluid is prevented from flowing through the end plates of the corrugated fin 3.

TWENTY-FIRST EMBODIMENT

Figure 29:
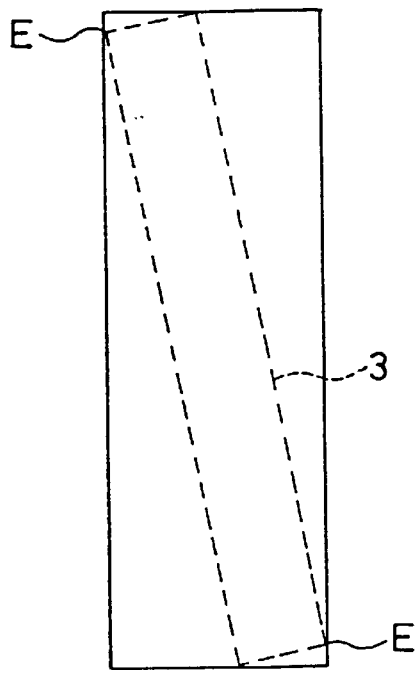
FIG. 29 is a schematic view showing a condition that a corrugated fin is arranged inside a fluid passage in a twenty-first embodiment.
Figure 30:
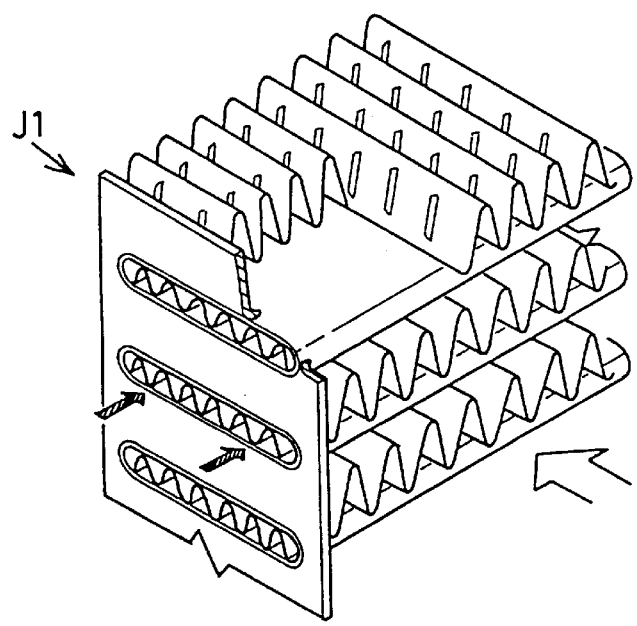
FIG. 30 is a principal perspective view showing a prior art heat exchanger.
Figure 31:
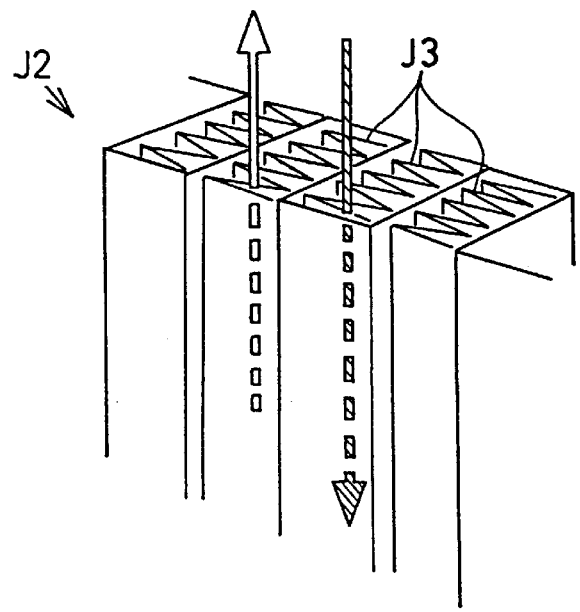
FIG. 31 is a principal perspective view showing a prior art heat exchanger.

According to a twenty-first embodiment, as shown in FIG. 29, both end corner portions E of the corrugated fin 3 contact inside walls of the tube 12 forming the fluid passage. Thereby, the fluid is prevented from flowing through gaps between the corrugated fin 3 and the inside walls of the tube 12, and is introduced into the grooves of the corrugated fin 3.

What is claimed is:

1. A heat exchanger for carrying out a heat exchange between a first fluid and a second fluid comprising:

a first fluid passage through which the first fluid flows;

a second fluid passage provided adjacent to said first fluid passage, through which the second fluid flows;

a partition wall provided between said first fluid passage and said second fluid passage for partitioning said first fluid passage and said second fluid passage from each other; and said corrugated fin is formed such that fin widths at a fluid inlet side and a fluid outlet side are shorter than that in a central region of said corrugated fin.

2. A heat exchanger for carrying out a heat exchange between a first fluid and a second fluid comprising:

a first fluid passage through which the first fluid flows;

a second fluid passage provided adjacent to said first fluid passage, through which the second fluid flows;

a partition wall provided between said first fluid passage and said second fluid passage for partitioning said first fluid passage and said second fluid passage from each other; and a corrugated fin disposed inside at least one of said first and second fluid passages, wherein said corrugated fin inclines with respect to a length direction of said first and second fluid passages, said first fluid passage and said second fluid passage extend in a longitudinal direction thereof, one of said first fluid passage and said second fluid passage includes a fluid inlet or a fluid outlet formed in a lateral plane thereof, and said fluid inlet or said fluid outlet is arranged in a central position of said first fluid passage and said second fluid passage in a length direction thereof.

3. A heat exchange for carrying out a heat exchange between a first fluid including a high temperature air and a second fluid including a low temperature air comprising:

a first fluid passage formed into a rectangular parallelepiped-shaped, through which the first fluid flows;

a second fluid passage formed into a rectangular parallelepiped-shaped, provided adjacent to said first fluid passage, through which the second fluid flows;

a partition wall provided between said first fluid passage and said second fluid passage for partitioning said first fluid passage and said second fluid passage from each other, and corrugated fins diagonally disposed in both said first and second fluid passages, each of which having plural corrugations extending perpendicularly with respect to a longitudinal direction of the corrugated fins, and corrugated fins in said first fluid passage and said corrugated fins in said second fluid passage being inclined in the same direction and arranged substantially at the same position with respect to each length direction of said first and second fluid passages;

wherein said first fluid passage and said second fluid passage have a projection for setting a position of said corrugated fins;

wherein both ends of said corrugated fin are formed to prevent the fluid from flowing through said corrugated fin.

4. A heat exchanger for carrying out a heat exchange between a first fluid and a second fluid comprising:

a first fluid passage through which the first fluid flows;

a second fluid passage provided adjacent to said first fluid passage, through which the second fluid flows;

a partition wall provided between said first fluid passage and said second fluid passage for partitioning said first fluid passage and said second fluid passage from each other; and a corrugated fin disposed inside at least one of said first and second fluid passages, wherein said corrugated fin inclines with respect to a length direction of said first and second fluid passages, both ends of said corrugated fin are formed to prevent the fluid from flowing through said corrugated fin, and fin louvers in both ends of said corrugated fin are covered by rectifier members.

5. A heat exchanger for carrying out a heat exchange between a first fluid including a high temperature air and a second fluid including a low temperature air comprising:

a first fluid passage formed into a rectangular parallelepiped-shaped, through which the first fluid flows;

a second fluid passage formed into a rectangular parallelepiped-shaped, provided adjacent to said first fluid passage, through which the second fluid flows;

a partition wall provided between said first fluid passage and said second fluid passage for partitioning said first fluid passage and said second fluid passage from each other, and corrugated fins diagonally disposed in both said first and second fluid passages, each of which having plural corrugations extending perpendicularly with respect to a longitudinal direction of the corrugated fins, and corrugated fins in said first fluid passage and said corrugated fins in said second fluid passage being inclined in the same direction and arranged substantially at the same position with respect to each length direction of said first and second fluid passages;

wherein said first fluid passage and said second fluid passage have a projection for setting a position of said corrugated fins.

6. A heat exchanger according to claim 5, wherein said first fluid passage includes a first fluid inlet and a first fluid outlet, said second fluid passage includes a second fluid inlet and a second fluid outlet, said first and second fluid passages form a rectangular parallelepiped-shaped fluid passage, said first fluid inlet and said first fluid outlet are formed in one side of a longitudinal plane and a lateral plane of said parallelepiped-shaped fluid passage, and said second fluid inlet and said second fluid outlet are formed in the other side of the longitudinal plane and the lateral plane of said rectangular parallelepiped-shaped fluid passage.

7. A heat exchanger according to claim 6, further comprising plural flanges connected to the fluid inlet or the fluid outlet which is formed in the longitudinal plane of said rectangular parallelepiped-shaped fluid passage, for collecting the fluid.

8. A heat exchanger according to claim 5, wherein a fluid inlet is formed in one side lateral plane of the rectangular parallelepiped-shaped fluid passage, and a fluid outlet is formed in the other side lateral plane of the rectangular parallelepiped-shaped fluid passage.

9. A heat exchanger according to claim 5, wherein one of said first fluid passage and said second fluid passage is constructed by a flat tube, the first fluid and the second fluid are partitioned by a flange connected at a opening region of said flat tube, and said flat tube penetrates said flange at the opening region thereof.

10. A heat exchanger according to claim 5, further comprising an inside member for rectifying or agitating the fluid.

11. A heat exchanger according to claim 5, wherein a fluid-flow direction in said corrugated fin is arranged with respect to an inlet side and outlet side ends of said corrugated fin.

12. A heat exchanger according to claim 5, wherein said first fluid passage and said second fluid passage extend in a longitudinal direction thereof, one of said first fluid passage and said second fluid passage includes a fluid inlet or a fluid outlet formed in a latitudinal plane thereof, and a passage width of the one of said first fluid passage and said second fluid passage are formed narrow at a side of said fluid inlet or said fluid outlet.

13. A heat exchanger according to claim 5, wherein said projection contacts an outer periphery of said corrugated fin.

14. A heat exchanger according to claim 5, wherein said projection is along a groove of said corrugated fin.

15. A heat exchanger according to claim 5, wherein at least one of said first fluid passage and said second fluid passage is formed by connecting a pair of plates, and said plate is made symmetrically with respect to a center line thereof.

16. A heat exchanger according to claim 5, wherein both edges of said corrugated fin contact an inside wall of said fluid passage.

17. A heat exchanger according to claim 5, wherein said corrugated fins in said first fluid passage and said corrugated fins in said second fluid passage have substantially the same shape.

18. A heat exchanger according to claim 5, wherein said first fluid and said second fluid flow in an opposite direction to each other.

19. A heat exchanger according to claim 5, wherein each of said first fluid passage and said second fluid passage includes a first fluid inlet and a second fluid inlet respectively, each of said first fluid passage and said second fluid passage include a space defined by an inside wall of said fluid passage and said corrugated fin, and said space is formed narrow at a position far from said fluid inlet.

* * * * *